(12) United States Patent
Pandey et al.

(10) Patent No.: US 11,894,450 B2
(45) Date of Patent: Feb. 6, 2024

(54) LATERAL BIPOLAR TRANSISTOR WITH EMITTER AND COLLECTOR REGIONS INCLUDING PORTIONS WITHIN IN-INSULATOR LAYER CAVITIES AND METHOD

(71) Applicant: GlobalFoundries U.S. Inc., Malta, NY (US)

(72) Inventors: Shesh Mani Pandey, Saratoga Springs, NY (US); Jeffrey B. Johnson, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 6 days.

(21) Appl. No.: 17/695,892

(22) Filed: Mar. 16, 2022

(65) Prior Publication Data
US 2023/0155011 A1    May 18, 2023

Related U.S. Application Data

(60) Provisional application No. 63/280,797, filed on Nov. 18, 2021.

(51) Int. Cl.
*H01L 29/735*  (2006.01)
*H01L 29/06*   (2006.01)
(Continued)

(52) U.S. Cl.
CPC ........ *H01L 29/735* (2013.01); *H01L 29/0649* (2013.01); *H01L 29/0808* (2013.01);
(Continued)

(58) Field of Classification Search
CPC . H01L 29/0649; H01L 29/1008; H01L 29/04; H01L 29/0804–0834;
(Continued)

(56) References Cited

U.S. PATENT DOCUMENTS

| 5,936,278 A | 8/1999 | Hu et al. |
| 6,927,428 B2 | 8/2005 | Babcock et al. |

(Continued)

FOREIGN PATENT DOCUMENTS

| EP | 0552697 A2 | 7/1993 |
| EP | 0552697 A3 | 7/1993 |

OTHER PUBLICATIONS

European Search Report for corresponding EP Application No. 22205700.2 dated Apr. 3, 2023, 9 pages.

(Continued)

*Primary Examiner* — Natalia A Gondarenko
(74) *Attorney, Agent, or Firm* — Francois Pagette; Hoffman Warnick LLC

(57) ABSTRACT

A disclosed structure includes a bipolar junction transistor (BJT) and a method of forming the structure. The structure includes a semiconductor layer on an insulator layer. The BJT includes a base region positioned laterally between emitter and collector regions. The emitter region includes an emitter portion of the semiconductor layer and an emitter semiconductor layer, which is within an emitter cavity in the insulator layer, which extends through an emitter opening in the emitter portion, and which covers the top of the emitter portion. The collector region includes a collector portion of the semiconductor layer and a collector semiconductor layer, which is within a collector cavity in the insulator layer, (Continued)

which extends through a collector opening in the collector portion, and which covers the top of the collector portion. Optionally, the structure also includes air pockets within the emitter and collector cavities.

20 Claims, 12 Drawing Sheets

(51) Int. Cl.
*H01L 29/08* (2006.01)
*H01L 29/10* (2006.01)
*H01L 29/66* (2006.01)
(52) U.S. Cl.
CPC ...... *H01L 29/0821* (2013.01); *H01L 29/1008* (2013.01); *H01L 29/6625* (2013.01)
(58) Field of Classification Search
CPC ............. H01L 29/1004; H01L 29/0696; H01L 29/41708; H01L 29/42304; H01L 27/0229–0244; H01L 27/0262; H01L 27/0263; H01L 27/082–0828; H01L 27/102; H01L 27/1022; H01L 27/11801; H01L 27/11896; H01L 27/2445; H01L 29/66234–66348; H01L 29/73–7378; H01L 29/739–7398; H01L 29/063; H01L 29/6656; H01L 29/0847; H01L 29/0673; H01L 29/775; H01L 29/66439; H01L 29/78696; H01L 29/42392; H01L 29/36; H01L 21/76897; H01L 21/823493; H01L 21/823475; H01L 21/823468; H01L 21/82285; H01L 21/823821; H01L 21/04; H01L 21/331; H01L 21/8222; H01L 21/8229; H01L 21/8249
USPC ................. 257/526, 350, E27.112, E21.461; 438/479, 430
See application file for complete search history.

(56) References Cited

U.S. PATENT DOCUMENTS

| 8,288,758 | B2* | 10/2012 | Ning ................... H01L 29/0808 |
| | | | 257/19 |
| 8,441,084 | B2 | 5/2013 | Cai et al. |
| 9,059,203 | B2* | 6/2015 | Furukawa ......... H01L 21/02104 |
| 9,437,718 | B1 | 9/2016 | Cai et al. |
| 9,502,504 | B2 | 11/2016 | Cai et al. |
| 9,525,027 | B2* | 12/2016 | Hashemi ............. H01L 29/0808 |
| 9,748,369 | B2 | 8/2017 | Liu |
| 11,152,496 | B2 | 10/2021 | Singh et al. |
| 2011/0169090 | A1* | 7/2011 | Mazure .................. H01L 21/84 |
| | | | 438/479 |
| 2013/0001647 | A1 | 1/2013 | Adler |
| 2015/0270335 | A1 | 9/2015 | Sadovnikov et al. |
| 2015/0287642 | A1* | 10/2015 | Chang .................... H01L 21/84 |
| | | | 438/339 |
| 2016/0087068 | A1* | 3/2016 | Cai ..................... H01L 29/7317 |
| | | | 257/526 |
| 2017/0092749 | A1 | 3/2017 | Cai et al. |
| 2017/0263656 | A1 | 9/2017 | Gordon et al. |
| 2019/0088766 | A1* | 3/2019 | Pandey ................ H01L 29/165 |
| 2021/0091180 | A1 | 3/2021 | Pekarik et al. |

OTHER PUBLICATIONS

Raman et al., "On the Performance of Lateral SiGe Heterojunction Bipolar Transistors With Partially Depleted Base," IEEE Transactions on Electron Devices, vol. 62, No. 8, 2015, pp. 2377-2383.
Koricic et al., "Double-Emitter Reduced-Surface-Field Horizontal Current Bipolar Transistor With 36 V Breakdown Integrated in BiCMOS at Zero Costar," IEEE Electron Device Letters, vol. 36, No. 2, 2015, pp. 90-92.
Suligoj et al., "Horizontal Current Bipolar Transistor With a Single Polysilicon Region for Improved High-Frequency Performance of BiCMOS ICs," IEEE Electron Device Letters, vol. 31, No. 6, 2010, pp. 534-536.

* cited by examiner

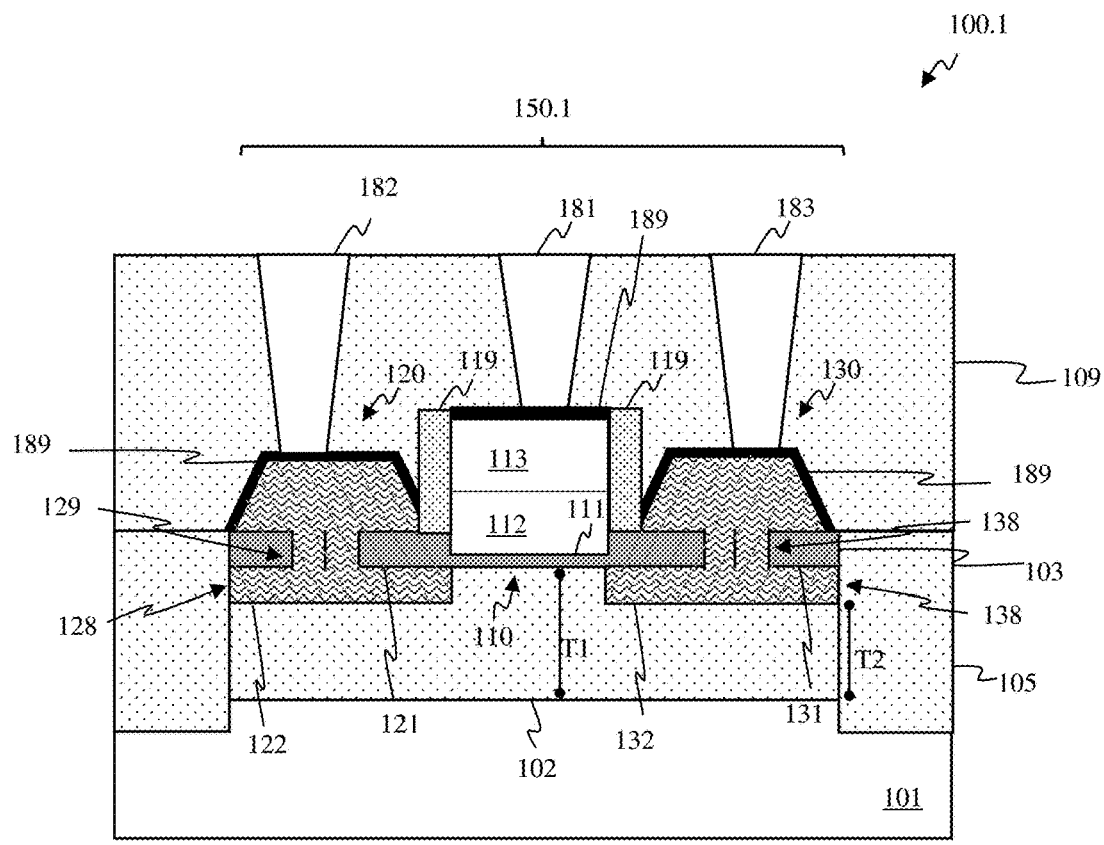
FIG. 1.1
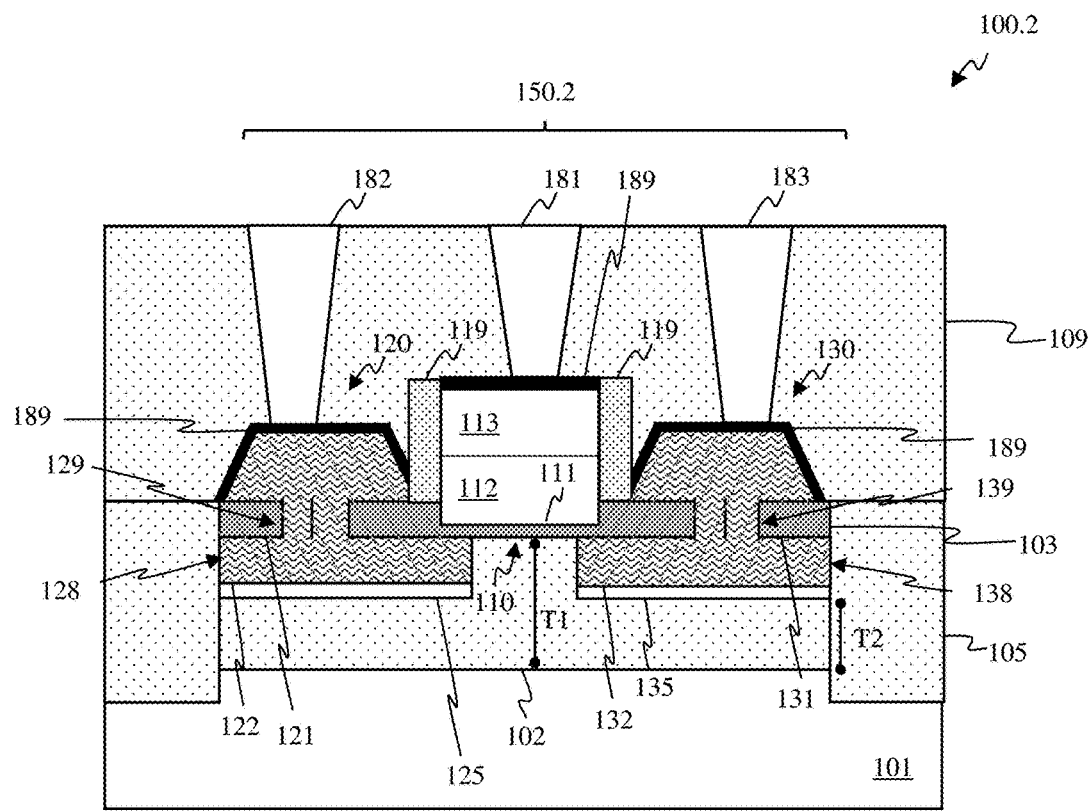
FIG. 1.2

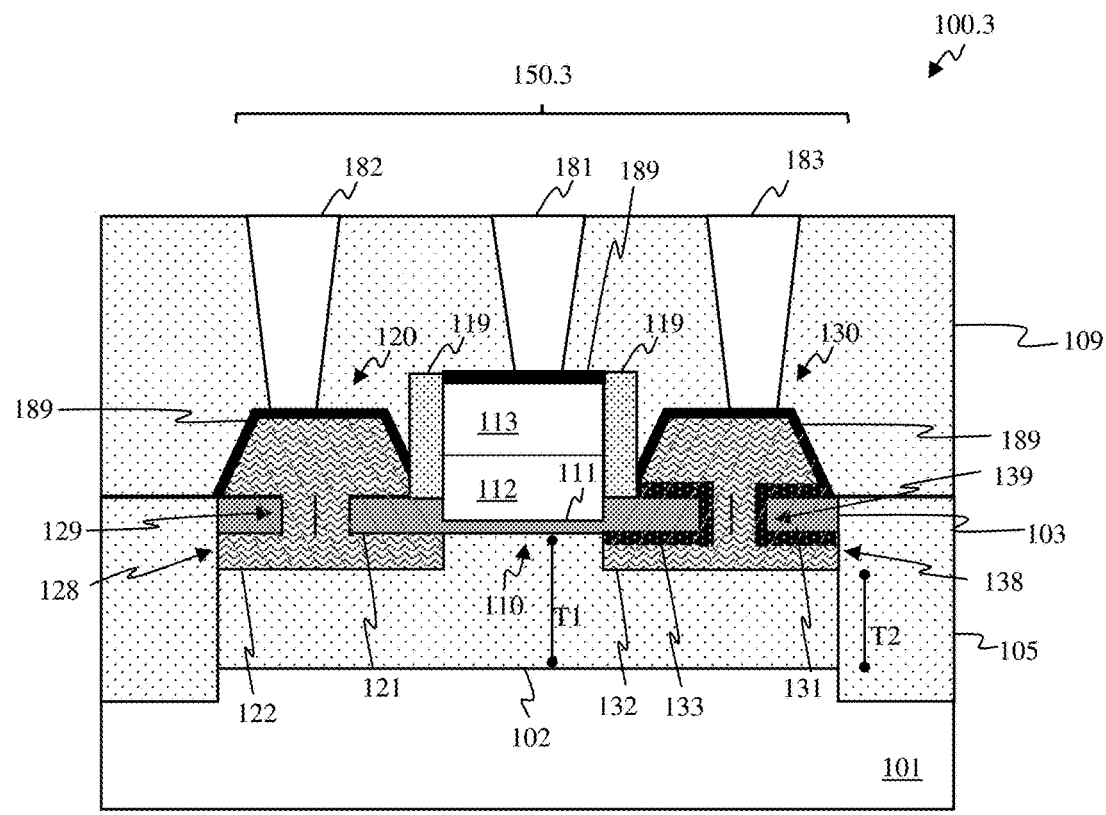
FIG. 1.3
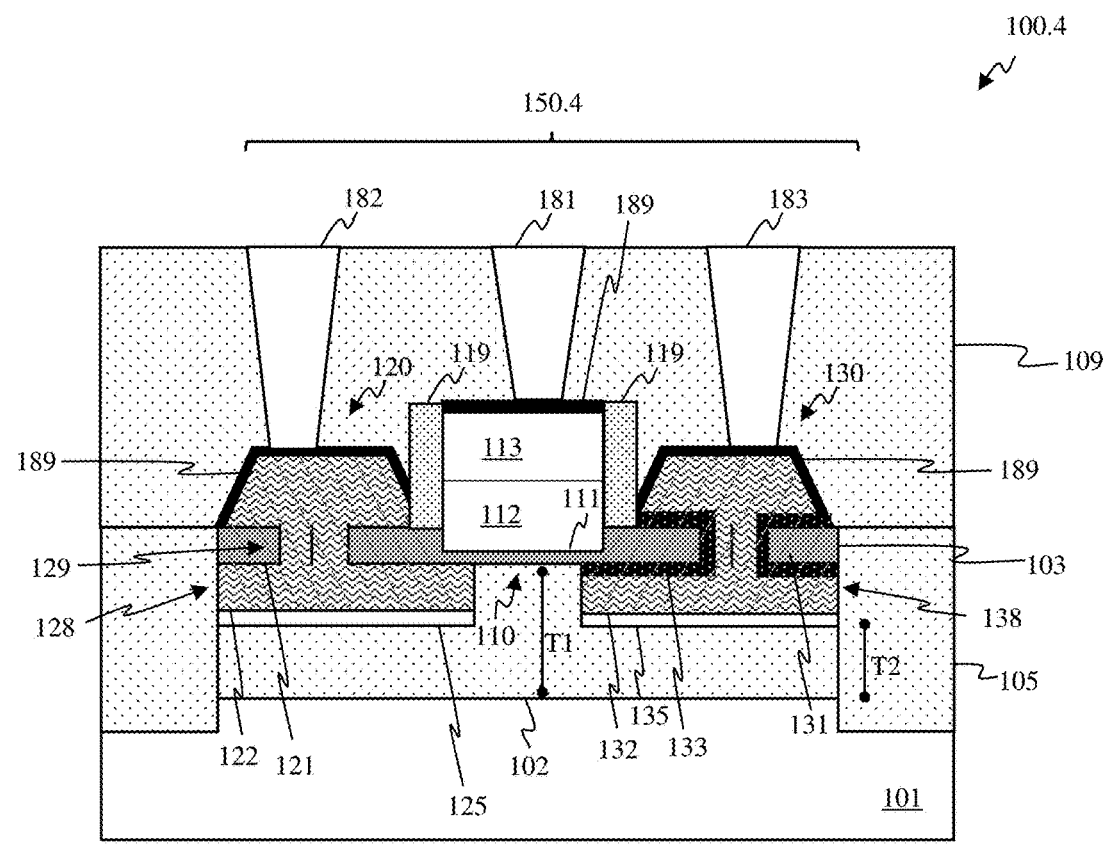
FIG. 1.4

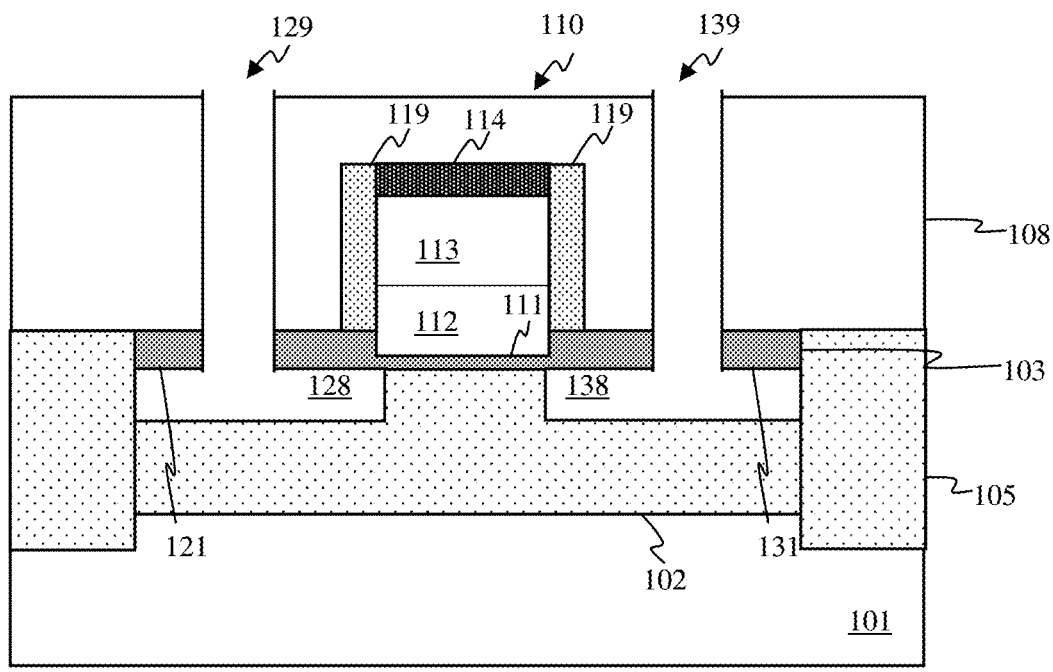
FIG. 10.1
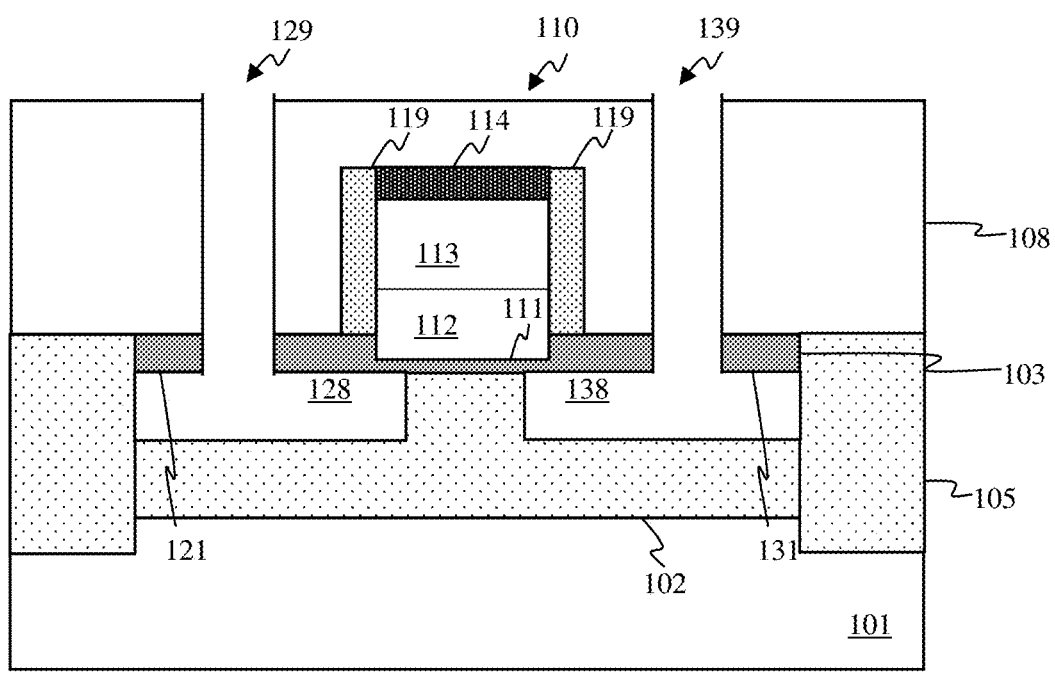
FIG. 10.2

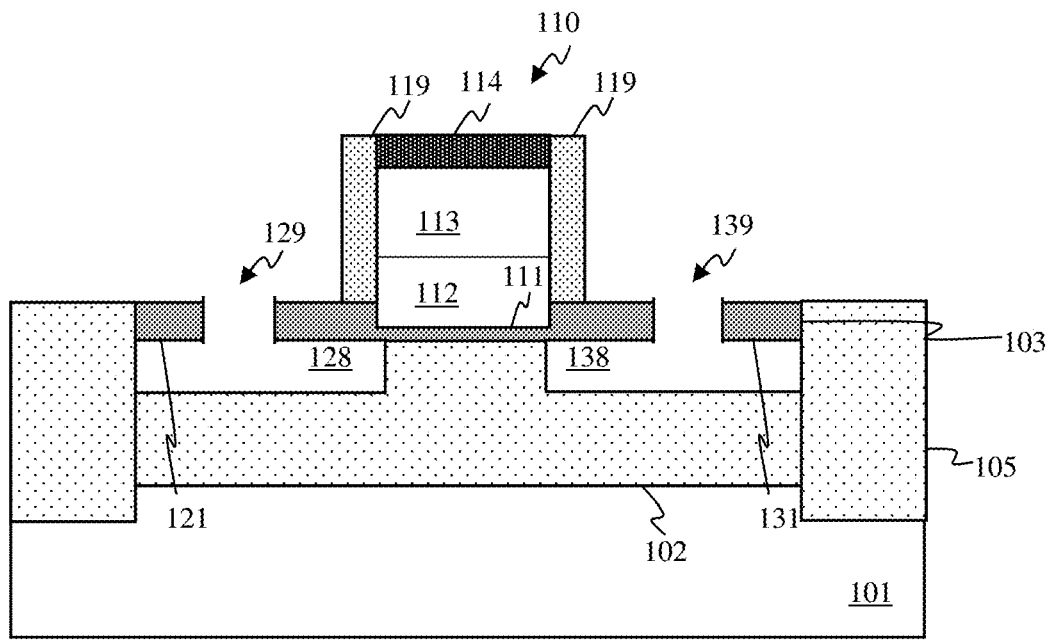
FIG. 11.1
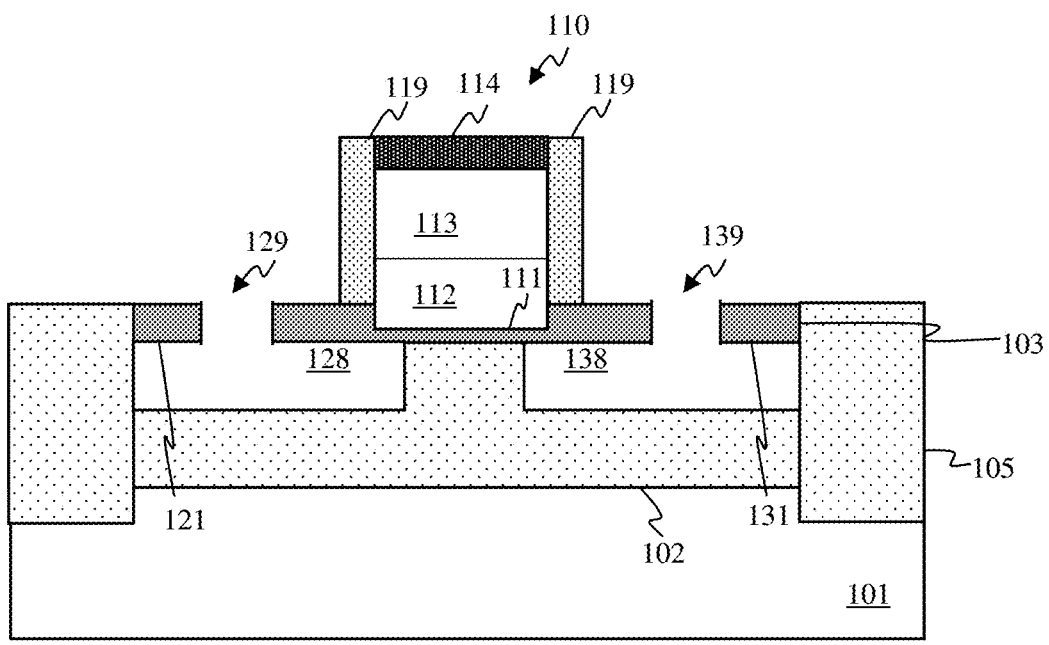
FIG. 11.2

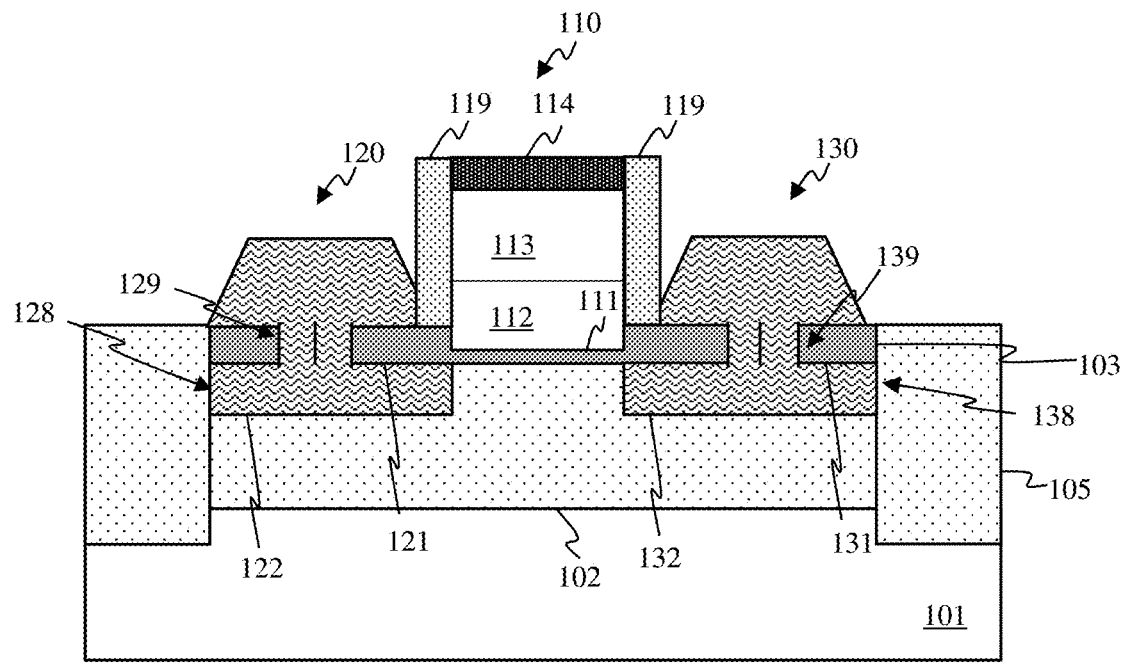
FIG. 12.1
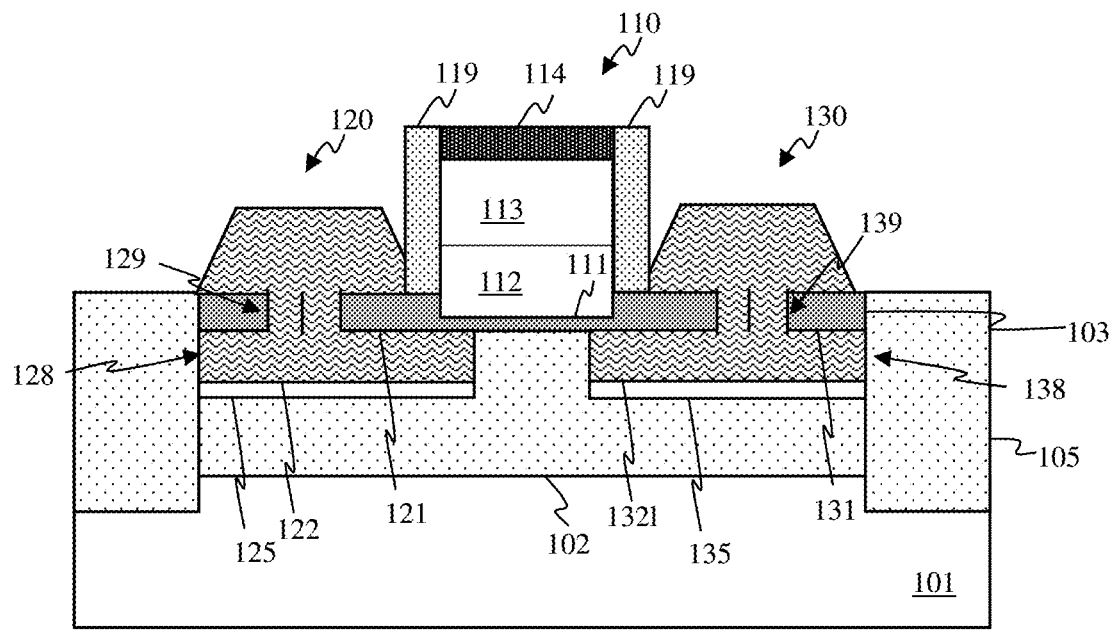
FIG. 12.2

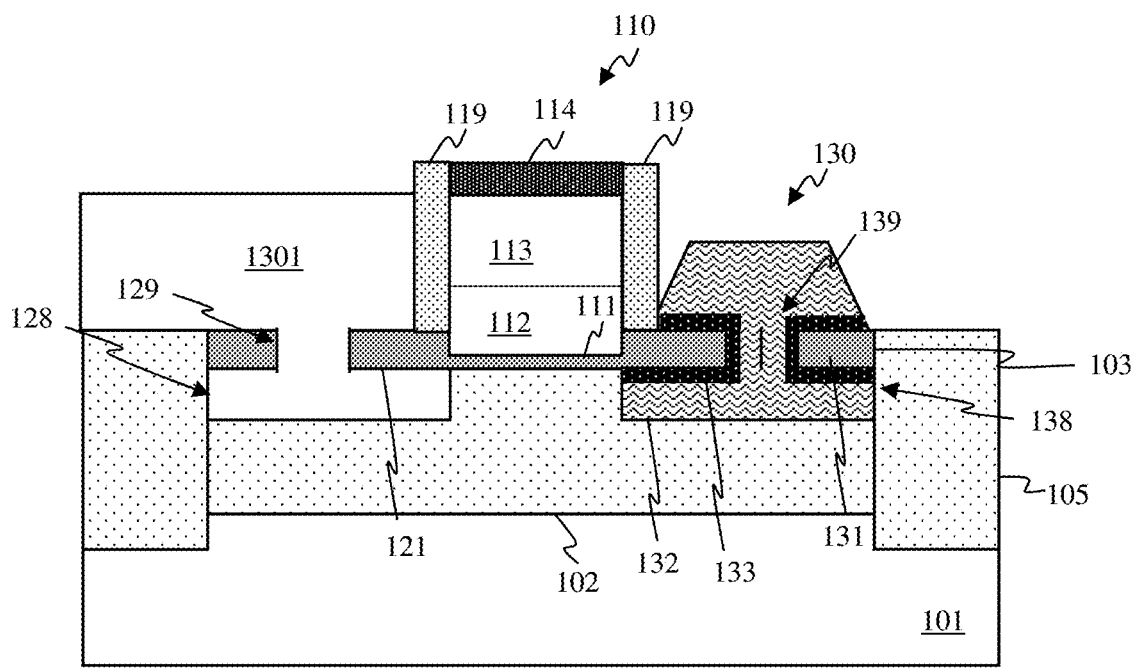
FIG. 13.1
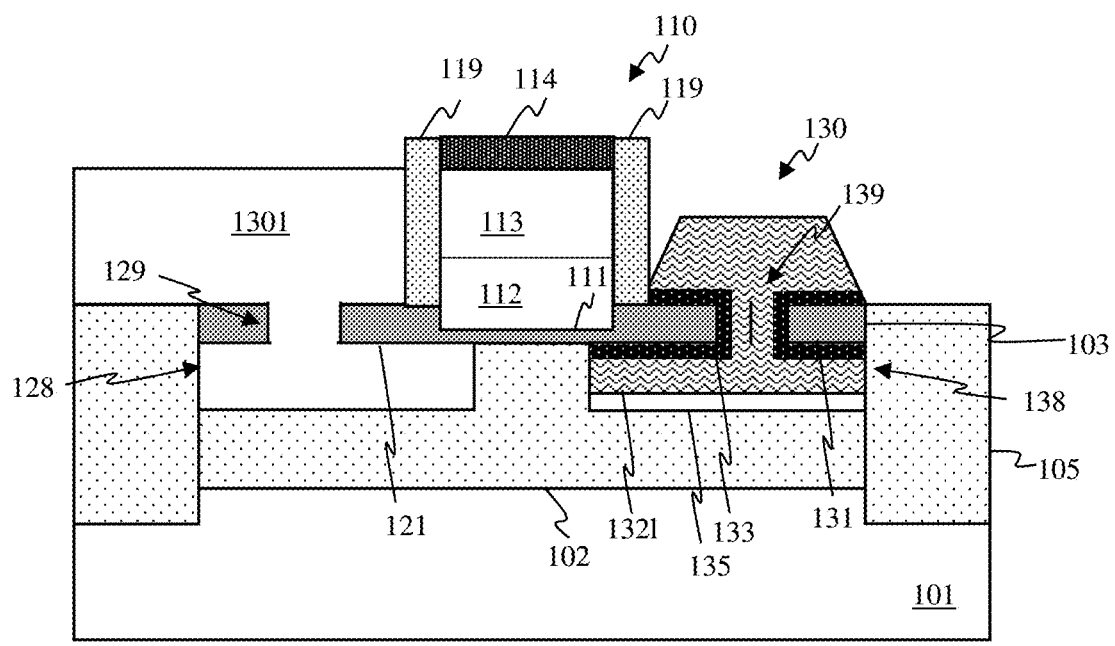
FIG. 13.2

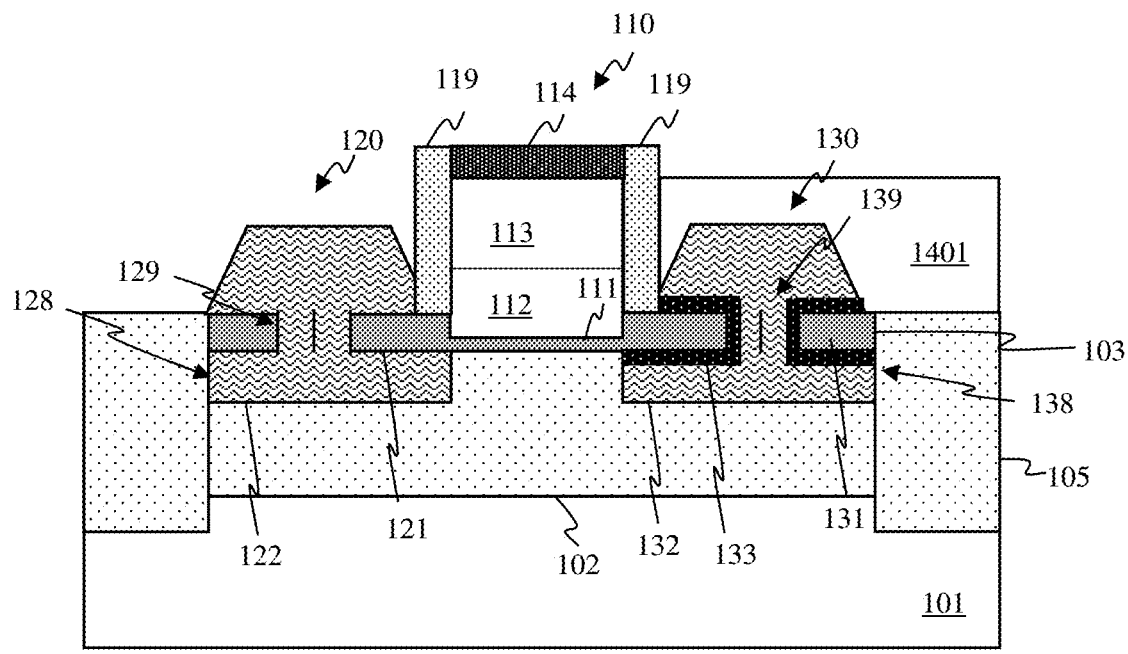
FIG. 14.1
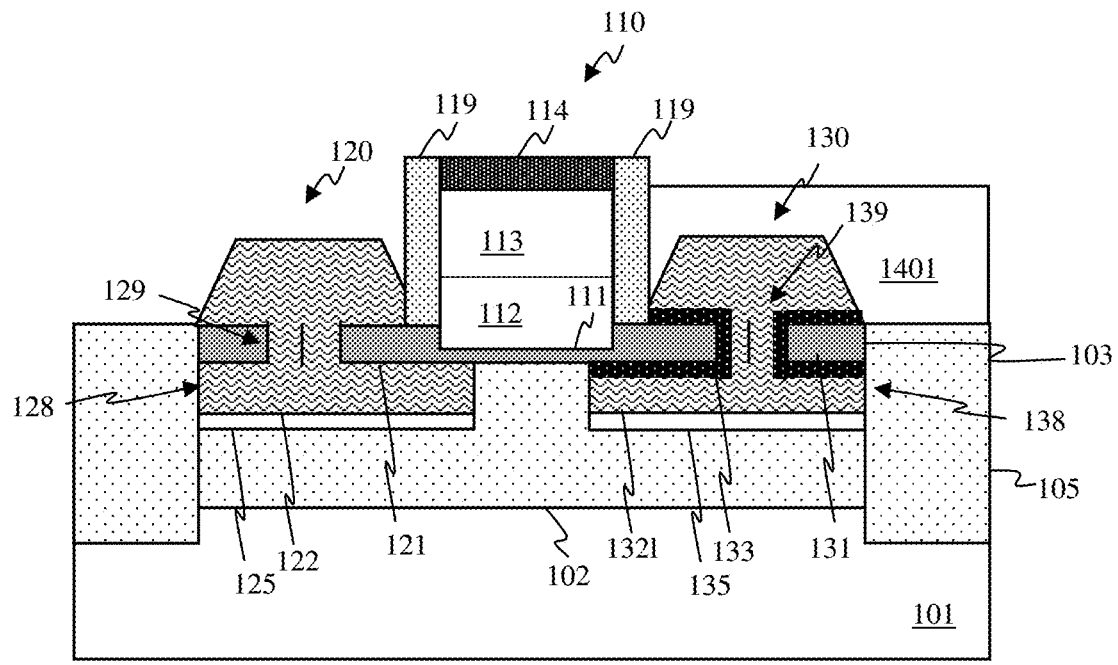
FIG. 14.2

LATERAL BIPOLAR TRANSISTOR WITH EMITTER AND COLLECTOR REGIONS INCLUDING PORTIONS WITHIN IN-INSULATOR LAYER CAVITIES AND METHOD

BACKGROUND

Field of the Invention

The present invention relates to bipolar junction transistors (BJTs) and, more particularly, to embodiments of semiconductor structure including a BJT and embodiments of a method of forming the semiconductor structure.

Description of Related Art

BJTs, which are laterally oriented with a base region positioned laterally between an emitter region and a collector region, have been developed that can be more integrated into silicon-on-insulator (SOI) complementary metal oxide semiconductor (CMOS) process flows. However, these devices can suffer from poor performance (e.g., low cut-off frequency (fT)/maximum oscillation frequency (fmax), low current gain, low breakdown voltage (BV), etc.).

SUMMARY

Disclosed herein are embodiments of a structure. The structure can include an insulator layer and a semiconductor layer on the insulator layer. The structure can further include an emitter region, a collector region and a base region. This emitter region can include an emitter portion of the semiconductor layer and an emitter semiconductor layer within an emitter cavity in the insulator layer adjacent to the emitter portion. The collector region can include a collector portion of the semiconductor layer and a collector semiconductor layer within a collector cavity in the insulator layer and adjacent to the collector portion. The base region can be positioned laterally between the emitter region and the collector region.

In some embodiments, the structure can include an insulator layer and a semiconductor layer on the insulator layer. The structure can further include an emitter region, a collector region, and a base region. The emitter region can include an emitter portion of the semiconductor layer and an emitter semiconductor layer that only partially fills an emitter cavity in the insulator layer and adjacent to the emitter portion. The collector region can include a collector portion of the semiconductor layer and a collector semiconductor layer that only partially fills a collector cavity in the insulator layer and adjacent to the collector portion. The base region can be positioned laterally between the emitter region and the collector region.

Also disclosed herein are embodiments of a method. The method can include forming a base region. The method can further include forming an emitter region and a collector region. The base region, emitter region and collector region can be formed such that the base region is positioned laterally between the emitter region and the collector region, such that the emitter region include an emitter portion of a semiconductor layer on an insulator layer and an emitter semiconductor layer within an emitter cavity in the insulator layer and immediately adjacent to the emitter portion, and such that the collector region includes a collector portion of the semiconductor layer and a collector semiconductor layer within a collector cavity in the insulator layer and immediately adjacent to the collector portion.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1.1-1.4 are cross-section diagrams illustrating embodiments of a semiconductor structure, respectively, each including a BJT;

FIG. 10.1 is a cross-section diagram illustrating a partially completed semiconductor structure formed according to the flow diagram of FIG. 2 during manufacturing of the semiconductor structures shown in FIG. 1.1 or 1.3;

FIG. 10.2 is a cross-section diagram illustrating a partially completed semiconductor structure formed according to the flow diagram of FIG. 2 during manufacturing of the semiconductor structures shown in FIG. 1.2 or 1.4;

FIG. 11.1 is a cross-section diagram illustrating a partially completed semiconductor structure formed according to the flow diagram of FIG. 2 during manufacturing of the semiconductor structures shown in FIGS. 1.1 or 1.3;

FIG. 11.2 is a cross-section diagram illustrating a partially completed semiconductor structure formed according to the flow diagram of FIG. 2 during manufacturing of the semiconductor structures shown in FIG. 1.2 or 1.4;

FIG. 12.1 is a cross-section diagram illustrating a partially completed semiconductor structure formed according to the flow diagram of FIG. 2 during manufacturing of the semiconductor structure shown in FIG. 1.1;

FIG. 12.2 is a cross-section diagram illustrating a partially completed semiconductor structure formed according to the flow diagram of FIG. 2 during manufacturing of the semiconductor structure shown in FIG. 1.2;

FIGS. 13.1 and 14.1 are cross-section diagrams illustrating partially completed semiconductor structures formed according to the flow diagram of FIG. 2 during manufacturing of the semiconductor structure shown in FIG. 1.3; and FIGS. 13.2 and 14.2 are cross-section diagrams illustrating partially completed semiconductor structures formed according to the flow diagram of FIG. 2 during manufacturing of the semiconductor structure shown in FIG. 1.4.

DETAILED DESCRIPTION

Figure 2:
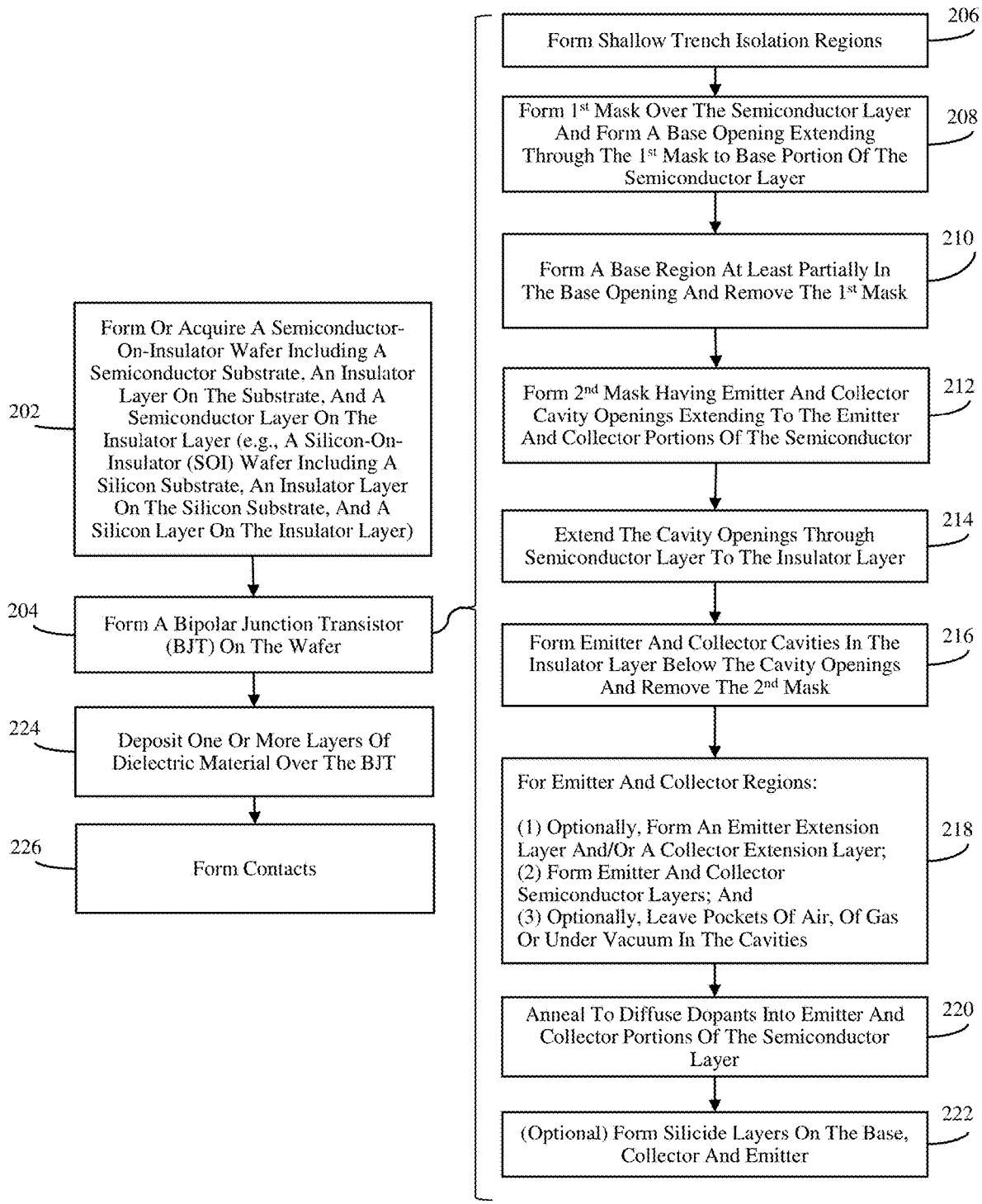
FIG. 2 is a flow diagram illustrating method embodiments for forming the disclosed semiconductor structure embodiments.

As mentioned above, BJTs, which are laterally oriented with a base region positioned laterally between an emitter region and a drain region, have been developed that can be integrated into the SOI CMOS process flows. However, these devices can suffer from poor performance.

In view of the foregoing, disclosed herein are embodiments of a semiconductor structure including a BJT configured for improved performance (e.g., increased maximum oscillation frequency (fmax), increased breakdown voltage (BV), etc.). Specifically, the structure can be a semiconductor-on-insulator structure (e.g., an SOI structure) including a semiconductor substrate, an insulator layer on the semiconductor substrate and a semiconductor layer on the insulator layer. Optionally, the BJT can be an HBT. In any case, the BJT can be above the insulator layer and can include an emitter region, a collector region, and a base region positioned laterally between the emitter region and the collector region. The emitter region can include an emitter portion of the semiconductor layer and an emitter semiconductor layer, which is within an emitter cavity in the insulator layer and immediately adjacent to the bottom of the emitter portion, which extends through an emitter opening in the emitter portion, and which further covers the top of the emitter portion. Similarly, the collector region can include a collector portion of the semiconductor layer and a collector semiconductor layer, which is within a collector cavity in the insulator layer and immediately adjacent to the bottom of the collector portion, which extends through a collector opening in the collector portion, and which further covers the top of the collector portion. Optionally, the structure can further include pockets of air, of gas or under vacuum within the emitter and collector cavities below the emitter and collector semiconductor layers, respectively. Optionally, the BJT can further include one or more extensions regions (e.g., a collector extension layer, as discussed further below). Also disclosed herein are method embodiments for forming such structures.

More particularly, referring to FIGS. 1.1-1.4 disclosed herein are embodiments of a semiconductor structure 100.1-100.4, respectively. The semiconductor structure 100A-100D can be, for example, a semiconductor-on-insulator structure (e.g., a SOI structure). That is, the semiconductor structure 100.1-100.4 can include a semiconductor substrate 101. The semiconductor substrate 101 can be, for example, a silicon substrate that is monocrystalline in structure. Optionally, the semiconductor substrate 101 can be doped so as to have P-type conductivity at a relatively low conductivity level. Thus, for example, the semiconductor substrate 101 could be a P– silicon substrate. Optionally, the semiconductor substrate 101 can include a buried well (not shown, also referred to as a buried dopant implant region). The buried well could be doped so as to have P-type conductivity (e.g., so as to be a buried Pwell). Alternatively, the buried well could be doped so as to have N-type conductivity (e.g., so as to be a buried Nwell).

The semiconductor structure 100.1-100.4 can further include an insulator layer 102 on the top surface of the semiconductor substrate 101. The insulator layer 102 can be, for example, a silicon dioxide layer (also referred to herein as a buried oxide (BOX) layer) or a layer of any other suitable insulator material.

The semiconductor structure 100.1-100.4 can further include a semiconductor layer 103 on the insulator layer 102. The semiconductor layer can be, for example, a silicon layer that is monocrystalline in structure. Alternatively, the semiconductor layer 103 could be a silicon germanium layer (e.g., due to a germanium condensation process step).

The semiconductor structure 100.1-100.4 can further include trench isolation structures 105 (e.g., shallow trench isolation (STI) regions). The trench isolation structures 105 can include trenches, which extend essentially vertically through the semiconductor layer 103 to the insulator layer 102. Optionally, these trenches can further extend through the insulator layer 102 and to or into the semiconductor substrate 101. The trenches can be filled with one or more layers of isolation material (e.g., silicon dioxide or some other suitable isolation material or material(s)). The isolation structures can be patterned so as to define an active device region for a device and, particularly, for a BJT, which is laterally oriented, as discussed further below.

The semiconductor structure 100.1-100.4 can further include a BJT 150.1-150.4, respectively, in the active device region. This BJT 150.1-150.4 can, as discussed in greater detail below, be either an NPN-type BJT or a PNP-type BJT. Optionally, the BJT can be an HBT.

Those skilled in the art will recognize that a BJT typically includes three terminals: a collector, an emitter, and a base between the collector and the emitter. In a BJT, the base is positioned laterally between collector and the emitter relative to the bottom surface of the substrate on which the BJT sits. An NPN-type BJT refers to a BJT, where the base or portion thereof has P-type conductivity and where the collector and the emitter have N-type conductivity. A PNP-type BJT refers to a BJT, where the base or portion thereof has N-type conductivity and where the collector and emitter have P-type conductivity. In the discussion below, reference is made to semiconductor layers and/or regions being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the BJT is an NPN-type BJT or a PNP-type BJT. Specifically, if the BJT is an NPN-type BJT, then the first-type conductivity refers to P-type conductivity and the second-type conductivity refers to N-type conductivity. However, if the BJT is a PNP-type BJT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

In the BJT, the same semiconductor material (e.g., silicon) can be used for the base, collector and emitter. Alternatively, as mentioned above, the BJT can be an HBT and in an HBT the collector and emitter are made, at least in part, of one semiconductor material (e.g., silicon) and the base is made, at least in part, of a different semiconductor material (e.g., silicon germanium). The use of differing semiconductor materials at the emitter-base junction and at the base-collector junction creates heterojunctions suitable for handling higher frequencies.

Thus, referring to FIGS. 1.1-1.4, the BJT 150.1-150.4 can include an emitter region 120, a collector region 130 and a base region 110 positioned laterally between the emitter region 120 and the collector region 130. However, in the disclosed embodiments, BJT performance is improved due, at least in part, to the novel configuration of the emitter and collector regions 120, which are contained, in part, within in-insulator cavities 125 and 135, respectively.

Specifically, the base region 110 can include a base portion 111 of the semiconductor layer 103 on the insulator layer 102. This base portion 111 can be positioned laterally between an emitter portion 121 and a collector portion 131 of the semiconductor layer 103. This base portion 111 can further be recessed (i.e., a recess can be in the top surface of the semiconductor layer 103 at the base portion) such that it is relatively thin as compared to the emitter portion 121 and the collector portion 131 on either side. As discussed in greater detail with regard to the method embodiments, the base portion 111 can further function as a seed layer for epitaxial deposition of base semiconductor layers thereon. This base portion 111 can be doped so as to have a first-type conductivity at a relatively low conductivity level. For example, base portion 111 can be a P− portion in the case of an NPN-type BJT or an N− portion in the case of a PNP-type BJT. The base region 110 can further include a base stack (including one or more base semiconductor layers) on the top surface of the base portion 111.

The base stack can include a base semiconductor layer 112 above and immediately adjacent to the base portion 111. This base semiconductor layer 112 can be an epitaxial semiconductor layer that is monocrystalline in structure. This base semiconductor layer 112 can be made of the same semiconductor material as the semiconductor layer 103 (e.g., silicon). Alternatively, in the case of an HBT, this base semiconductor layer 112 can be made of a different semiconductor material than the semiconductor layer 103 (e.g., if the semiconductor layer 103 is silicon, the base semiconductor layer 112 could be silicon germanium). In any case, the base semiconductor layer 112 can be undoped or, alternatively, can be doped so as to have the first-type conductivity. For example, for an NPN-type BJT, the base semiconductor layer 112 can be undoped (i.e., an intrinsic base layer). Alternatively, for an NPN-type BJT, the base semiconductor layer 112 can be doped so as to have P-type conductivity at a relatively low conductivity level (i.e., a P− base semiconductor layer), so as to have a graded P-type profile (e.g., from undoped or P− at the bottom surface near the base portion 111 of the semiconductor layer 103 to P or P+ at the top surface), or so as to have P-type conductivity at a relatively high conductivity level (i.e., a P+ base layer). Similarly, for a PNP-type BJT, the base semiconductor layer 112 can be undoped (i.e., an intrinsic base layer). Alternatively, for a PNP-type BJT, the base semiconductor layer 112 can be doped so as to have N-type conductivity at a relatively low conductivity level (i.e., an N− base layer), so as to have a graded N-type profile (e.g., from undoped or N− at the bottom surface near the base portion 111 of the semiconductor layer 103 to N or N+ at the top surface), or so as to have N-type conductivity at a relatively high conductivity level (i.e., a N+ base layer). Optionally, the base stack can further include an additional base semiconductor layer 113 (also referred to herein as an extrinsic base layer) above and immediately adjacent to the base semiconductor layer 112. This additional base semiconductor layer 113 can be another epitaxial semiconductor layer that is either polycrystalline, amorphous or monocrystalline in structure. The additional base semiconductor layer 113 can be made of the same semiconductor material as the base semiconductor layer 112 or, alternatively, a different semiconductor material. For example, the base semiconductor layer 112 can be monocrystalline silicon and the additional base semiconductor layer 113 can be polysilicon. Alternatively, in the case of an HBT, the base semiconductor layer 112 can be monocrystalline silicon germanium and the additional base semiconductor layer 113 can be polysilicon. In any case, the additional base semiconductor layer 113 can be doped so as to have the first-type conductivity at a relatively high conductivity level. For example, for an NPN-type BJT, the additional base semiconductor layer 113 can be a P+ base layer; whereas, for a PNP-type HBT, the additional base semiconductor layer 113 can be an N+ base layer.

Base sidewall spacers 119 can be positioned laterally adjacent to opposing sidewalls of the base stack. The base sidewall spacers 119 can be made, for example, of silicon nitride, silicon carbon nitride, silicon boron carbon nitride or any other suitable sidewall spacer material.

It should be noted that the configuration of the base region 110 shown in the figures and described above is exemplary and provided for illustration purposes. This base region configuration is not intended to be limiting and, alternatively, any other suitable base region configuration could be employed. For example, instead of being essentially rectangular in shape (as illustrated in the figures), the base region 110 could be essentially T-shaped. That is, the base region 110 could, alternatively, include relatively narrow lower portion on the base portion 111 and a relatively wide upper portion on the lower portion and extending laterally over the base sidewall spacers 119 and, optionally, further extending laterally over additional sidewalls spacers formed from base mask material during base region processing.

The emitter region 120 can include: the emitter portion 121 of the semiconductor layer 103; and an emitter semiconductor layer 122 above and below. More specifically, at least one emitter cavity opening 129 can extend vertically through the emitter portion 121 of the semiconductor layer 103. An emitter cavity 128 can be within the insulator layer 102 aligned below the emitter cavity opening 129. The bottom surface of the emitter portion 121 of the semiconductor layer 103 as well as surfaces of the insulator layer 102 are exposed within the cavity 128 during processing. The emitter semiconductor layer 122 can be an epitaxial semiconductor layer that is monocrystalline in structure. The emitter semiconductor layer 122 can have a lower portion within the emitter cavity 128 immediately adjacent to the bottom surface of the emitter portion 121 of the semiconductor layer 103, a middle portion filling the emitter cavity opening 129, and an upper portion covering the top surface of the emitter portion 121 of the semiconductor layer 103. The upper portion can be physically separated from the base region 110 by one of the base sidewall spacers 119.

Figure 3:
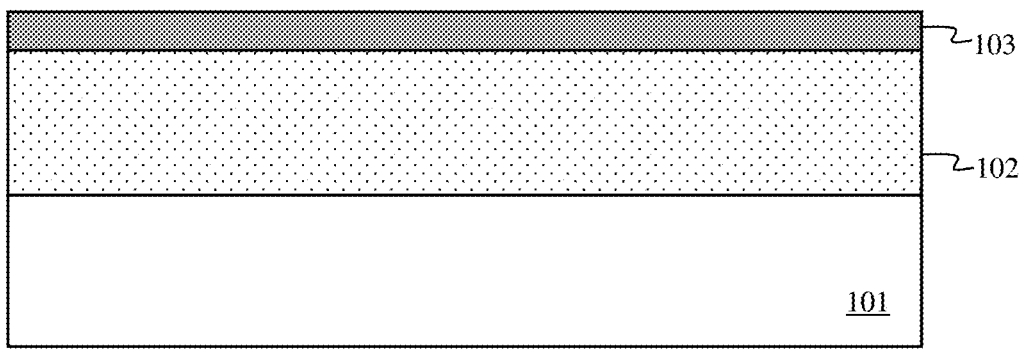
FIGS. 3-5 are cross-section diagrams illustrating partially completed semiconductor structures formed according to the flow diagram of FIG. 2.
Figure 4:
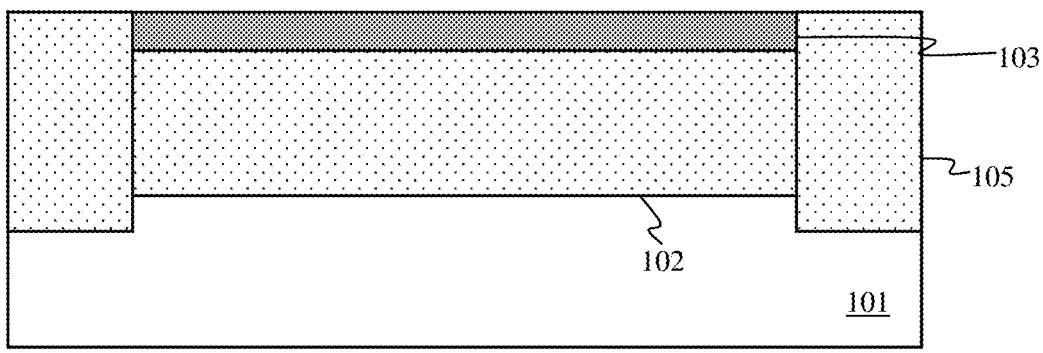

It should be noted that, due to a selective epitaxial deposition process used during processing and further depending upon the sizes of the emitter cavity opening 129 and the emitter cavity 128, the emitter semiconductor layer 122 either may completely fill the emitter cavity 128 from the bottom surface of the emitter portion 121 downward (e.g., see the semiconductor structure 100.1 of FIG. 1 or the semiconductor structure 100.3 of FIG. 3, each having a relatively shallow emitter cavity completely filled by the emitter semiconductor layer 122) or may block the emitter cavity opening 129 when the emitter cavity 128 is only partially filled from the bottom surface of the emitter portion 121 downward, thereby leaving a pocket 125 of air, gas or under vacuum at the bottom of the emitter cavity 128 below the emitter semiconductor layer 122 (e.g., see the semiconductor structure 100.2 of FIG. 2 or the semiconductor structure 100.4 of FIG. 4, each having a relatively deep emitter cavity partially filled by the emitter semiconductor layer 122 and including a pocket 125 of air, of gas or under vacuum). For purposes of this disclosure, a pocket of air, of gas or under vacuum refers to a space encapsulated by solid materials and filled with air, gas or under vacuum such that the air, etc. is trapped within the space. When filled with air, such a pocket is often referred to in the art as an air-gap.

The collector region 130 can include: a collector portion 131 of the semiconductor layer 103; and a collector semiconductor layer 132 above and below. More specifically, at least one collector cavity opening 139 can extend vertically through the collector portion 131 of the semiconductor layer 103. A collector cavity 138 can be within the insulator layer 102 aligned below the collector cavity opening 139. The bottom surface of the collector portion 131 of the semiconductor layer 103 as well as surfaces of the insulator layer 102 are exposed within the cavity 138 during processing. The collector semiconductor layer 132 can be an epitaxial semiconductor layer that is monocrystalline in structure. The collector semiconductor layer 132 can have a lower portion within the collector cavity 138 immediately adjacent to the bottom surface of the collector portion 131 of the semiconductor layer 103, a middle portion filling the collector cavity opening 139, and an upper portion covering the top surface of the collector portion 131 of the semiconductor layer 103. The upper portion can be physically separated from the base region 110 by one of the base sidewall spacers 119.

Due to the cavities 128 and 138, the insulator layer 102 has a first thickness (T1) below the base portion 111 of the semiconductor layer 103 (as measured from the top surface of the semiconductor substrate to the top of the insulator layer in the area) and a second thickness (T2) that is less than the first thickness below the emitter and collector portions 121 and 131 of the semiconductor layer 103 (again as measured from the top surface of the semiconductor substrate to the top of the insulator layer in that area).

It should be noted that, due to a selective epitaxial deposition process and further depending upon the sizes of the collector cavity opening 139 and the collector cavity 138, the collector semiconductor layer 132 either may completely fill the collector cavity 138 from the bottom surface of the collector portion 131 downward (e.g., see the semiconductor structure 100.1 of FIG. 1 or the semiconductor structure 100.3 of FIG. 3, each having a relatively shallow emitter cavity completely filled by the emitter semiconductor layer 122) or may block the collector cavity opening 139 when the collector cavity 138 is only partially filled from the bottom surface of the collector portion 131 downward, thereby leaving a pocket 135 of air, gas or under vacuum at the bottom of the collector cavity 138 below the collector semiconductor layer 132 (e.g., see the semiconductor structure 100.2 of FIG. 2 or the semiconductor structure 100.4 of FIG. 4, each having a relatively deep collector cavity partially filled by the collector semiconductor layer 132 and including a pocket 135 of air, of gas or under vacuum). As mentioned above, for purposes of this disclosure, a pocket of air, of gas or under vacuum refers to a space encapsulated by solid materials and filled with air, gas or under vacuum such that the air, etc. is trapped within the space. When filled with air, such a pocket is often referred to in the art as an air-gap.

The emitter semiconductor layer 122 and the collector semiconductor layer 132 can be in situ doped during processing so as to have the second-type conductivity at a relatively high conductivity level. For example, for an NPN-type BJT, the emitter and collector semiconductor layers 122 and 132 can be doped so as to be N+ emitter and collector semiconductor layers; whereas, for a PNP-type BJT, the emitter and collector semiconductor layers 122 and 132 can be doped so as to be P+ emitter and collector semiconductor layers. Furthermore, due to an anneal process, dopants from the emitter and collector semiconductor layers 122 and 132 diffuse into the emitter and collector portions 121 and 131 of the semiconductor layer 103 so that these portions also have the second-type conductivity (e.g., see the diagonal gray lines in FIGS. 1.1-1.4 representing dopant diffusion of the second-type conductivity throughout the emitter and collector regions 120 and 130, including within the emitter and collector portions 121 and 131, respectively, of the semiconductor layer 103).

As illustrated in the semiconductor structures 100.1 of FIGS. 1.1 and 100.2 of FIG. 1.2, the emitter region 120 and the collector region 130 can be essentially symmetric relative to the base region 110. Optionally, in such embodiments, the BJT can further include additional symmetric components (not shown). For example, the BJT could include emitter and collector extension layers, which are relatively thin epitaxial semiconductor layers selectively grown during processing prior to selective epitaxial growth of the emitter and collector semiconductor layers 122 and 132 such that they physically separate the emitter and collector semiconductor layers 122 and 132 from the emitter and collector portions 121 and 131 of the semiconductor layer 103. Such emitter and collector extension layers can be made of the same material as the emitter and collector semiconductor layers 122 and 132 (e.g., silicon (Si)) or a different material (e.g., silicon carbide (SiC)). Additionally and/or alternatively, such emitter and collector extension layers can have different conductivity levels (e.g., lower or higher) than the emitter and collector semiconductor layers 122 and 132. It should be noted that if such emitter and collector extension layers are present in the BJT structure, the amount of dopant diffusion (as represented by the diagonal gray lines) into the emitter and collector portions 121 and 131 of the semiconductor layer 103 and, thereby the conductivity levels of the emitter and collector portions 121 and 131 will depend upon the concentration of dopants in the emitter and collector extension layers.

In other embodiments, the emitter region 120 and the collector region 130 can be essentially asymmetric relative to the base region 110. For example, although the sizes of the emitter and collector regions are shown in the figures as being essentially identical and although the spacing between the base region and the emitter and collector regions are also shown in the figures as being essentially identical, alternatively the emitter and collector regions can have different sizes and/or the spacing between the base region and the emitter region and the spacing between the base region and the collector region can be different.

Additionally, in other embodiments, the BJT can include one or more asymmetric components. For example, as shown in the semiconductor structure 100.3 of FIG. 1.3 and the semiconductor structure 100.4 of FIG. 1.4, the BJT could include a collector extension layer 133 only without an emitter extension layer. This collector extension layer 133 can be a relatively thin epitaxial semiconductor layer selectively grown on exposed semiconductor surfaces of the collector portion 131 during processing prior to selective epitaxial growth of collector semiconductor layer 132 (and while the emitter portion 121 is masked) such that the collector semiconductor layer 132 is physically separated from the collector portion 131 of the semiconductor layer 103 by the collector extension layer 133. The collector extension layer 133 can be made of the same material as the collector semiconductor layer 132 (e.g., silicon (Si)) or a different material (e.g., silicon carbide (SiC)). Additionally or alternatively, the collector extension layer 133 can have a different conductivity level (e.g., lower or higher) than the collector semiconductor layer 132. It should be noted that when such a collector extension layer 133 is present, the amount of dopant diffusion (as represented by the diagonal gray lines) into the collector portion 131 of the semiconductor layer 103 and, thereby the conductivity level of the collector portion 131 will depend upon the concentration of dopants in the collector extension layer 133 and can be different from the conductivity level of the emitter portion 121.

Optionally, the BJT 150.1-150.4 can further include metal silicide layers 189 on the top surface of the emitter semiconductor layer 122 of the emitter region 120, on the top surface of the collector semiconductor layer 132 of the collector region 130, and on the top surface of the base stack (e.g., on the additional base semiconductor layer 113) of the base region 110. The metal silicide layers 189 can be, for example, layers of cobalt silicide (CoSi), nickel silicide (NiSi), tungsten silicide (WSi), titanium silicide (TiSi), or any other suitable metal silicide material.

The semiconductor structure 100.1-100.4 can further include one or more layers of middle of the line (MOL) dielectric material 109 covering the BJT 150.1-150.4. These layer(s) of MOL dielectric material 109 can include, but are not limited to, a first dielectric layer. The first dielectric layer can be, for example, a relatively thin conformal dielectric layer (also referred to herein as an etch stop layer) over emitter region 120, the base region 110 and the collector region 130. This relatively thin conformal dielectric layer can be made of silicon nitride or some other suitable etch stop material. These layer(s) of MOL dielectric material 109 can also include a second dielectric layer on the first dielectric layer. The second dielectric layer can be, for example, a blanket layer of interlayer dielectric (ILD) material. This ILD material can be, for example, silicon dioxide, doped silicon glass (e.g., phosphosilicate glass (PSG) or borophosphosilicate glass (BPSG)), or any other suitable ILD material.

The semiconductor structure 100.1-100.4 can further include MOL contacts that extend essentially vertically through the layer(s) of MOL dielectric material 109 to the BJT terminals (e.g., see the emitter contact 182, the base contact 181, and the collector contact 183).

Referring to the flow diagram of FIG. 2, also disclosed herein are embodiments of methods for forming a semiconductor structure with a BJT having collector and emitter regions at least partially contained within in-insulator layer cavities (e.g., such as the semiconductor structures 100.1-100.4 with the BJTs 150.1-150.4 described above and illustrated in FIGS. 1.1-1.4, respectively).

The method can include forming or otherwise acquiring a semiconductor-on-insulator wafer (e.g., a silicon-on-insulator (SOI) wafer) (see process 202 and FIG. 3). The wafer can include a semiconductor substrate 101. The semiconductor substrate 101 can be, for example, monocrystalline silicon substrate. The wafer can further include an insulator layer 102 on the top surface of the semiconductor substrate 101. The insulator layer 102 can be, for example, a silicon dioxide layer (also referred to herein as BOX layer) or a layer of any other suitable insulator material. The wafer can further include a semiconductor layer 103 on the insulator layer 102. The semiconductor layer can be, for example, a monocrystalline silicon layer or a monocrystalline semiconductor layer of some other suitable semiconductor material.

The method can further include forming a BJT on the wafer (see process 204). This BJT can be formed as either an NPN-type BJT or a PNP-type BJT. Optionally, the BJT can be formed as an HBT.

To form the BJT, trench isolation regions 105 (e.g., STI regions) can be formed to define an active device region (see process 206 and FIG. 4). Such STI regions can be formed using conventional STI processing techniques. For example, trench trenches can be formed (e.g., lithographically patterned and etch) such that they extend essentially vertically through the semiconductor layer 103 to the insulator layer 102. Optionally, these trenches can be formed such that they extend through the insulator layer 102 and to or into the semiconductor substrate 101. The trenches can be filled with one or more layers of isolation material (e.g., silicon dioxide or some other suitable isolation material or material(s)). Then, a chemical mechanical polishing (CMP) process can be performed in order to remove all isolation materials from above the level of the top surface of the semiconductor layer 103.

Figure 5:
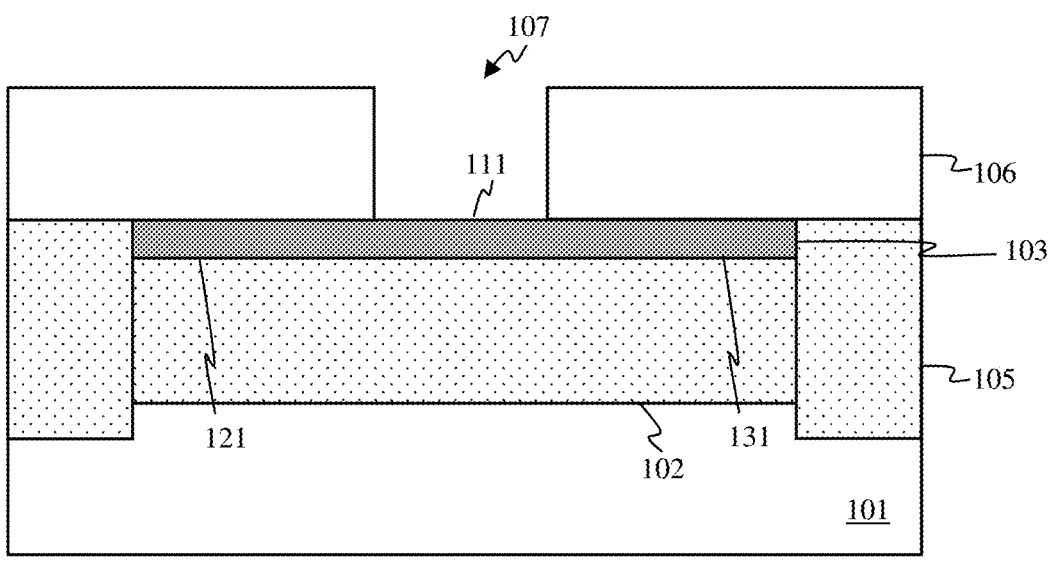

A first mask 106 (also referred to herein as a base mask) can be formed on the top surface of the semiconductor layer 103 (see process 208 and FIG. 5). This first mask 106 can be formed of an isolation material (e.g., silicon dioxide using a conventional oxidation process). A base opening 107 can be formed such that it extends essentially vertically through the first mask 106 to a base portion 111 of the semiconductor layer 103. The base portion 111 of the semiconductor layer 103 can be positioned laterally between an emitter portion 121 and a collector portion 131 of the semiconductor layer 103. The base opening 107 can, for example, be formed using conventional lithographic patterning and etch processes.

Figure 6A:
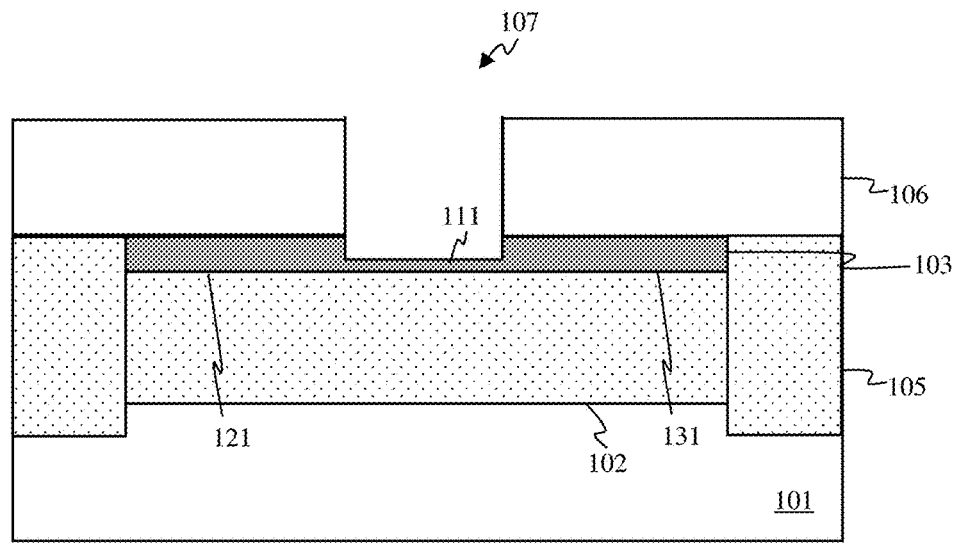
FIGS. 6a-6c are cross-section diagrams illustrating an exemplary technique for forming a base region at process 210 of the flow diagram of FIG. 2.
Figure 6B:
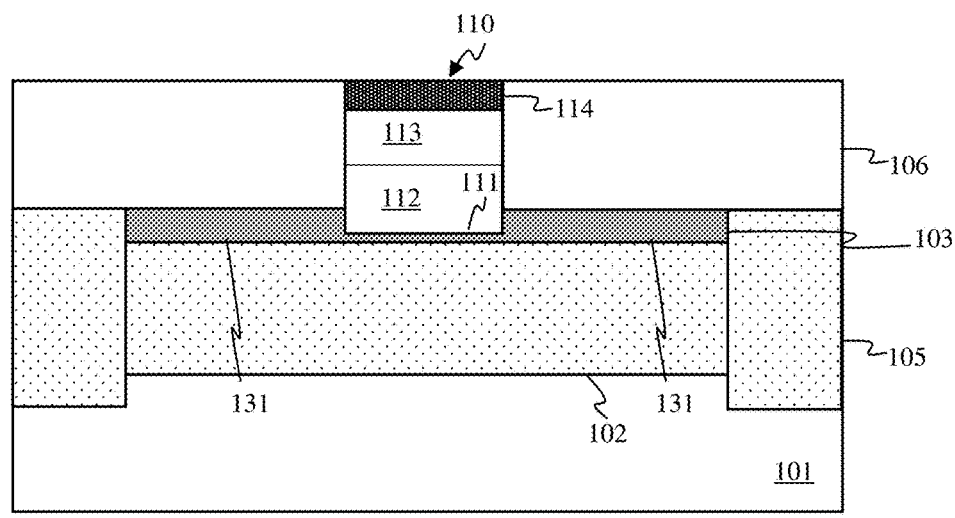
Figure 6C:
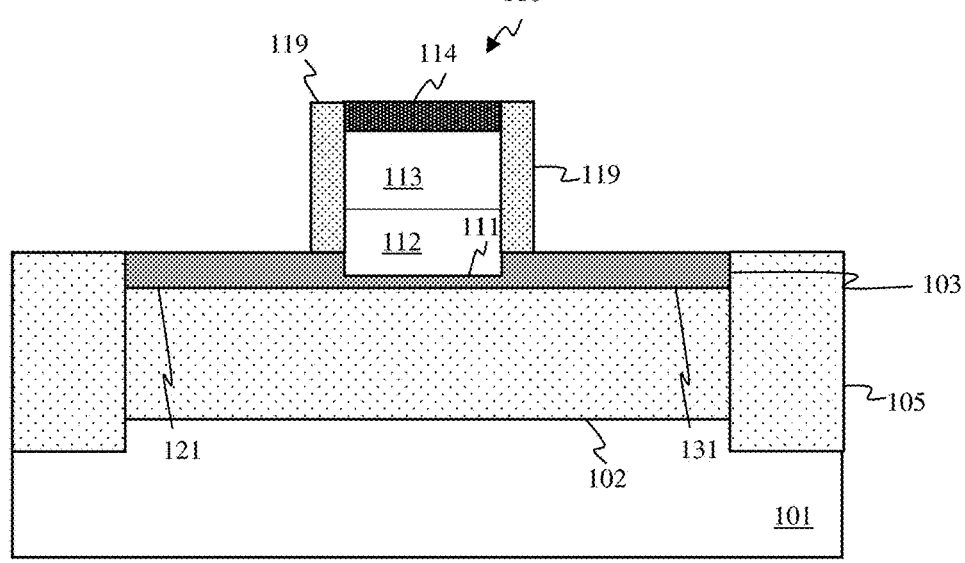
Figure 7A:
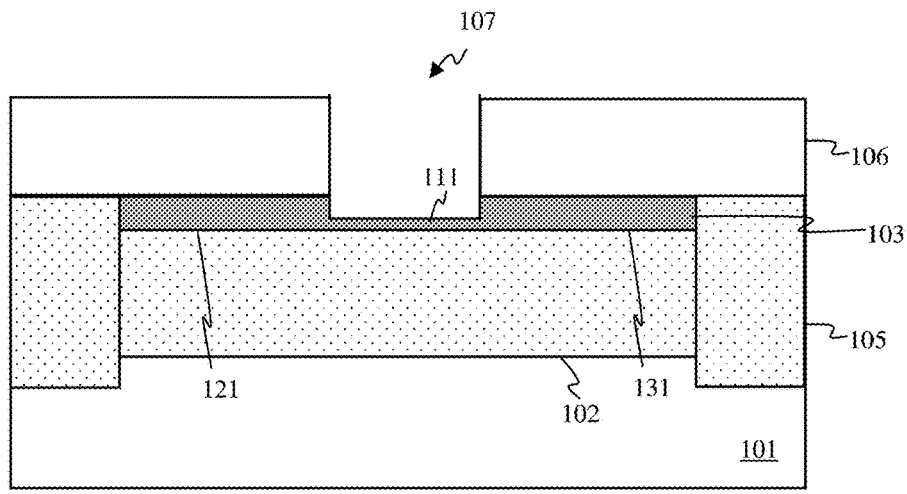
FIGS. 7a-7c are cross-section diagrams illustrating an alternative technique for forming a base region at process 210 of the flow diagram of FIG. 2.
Figure 7B:
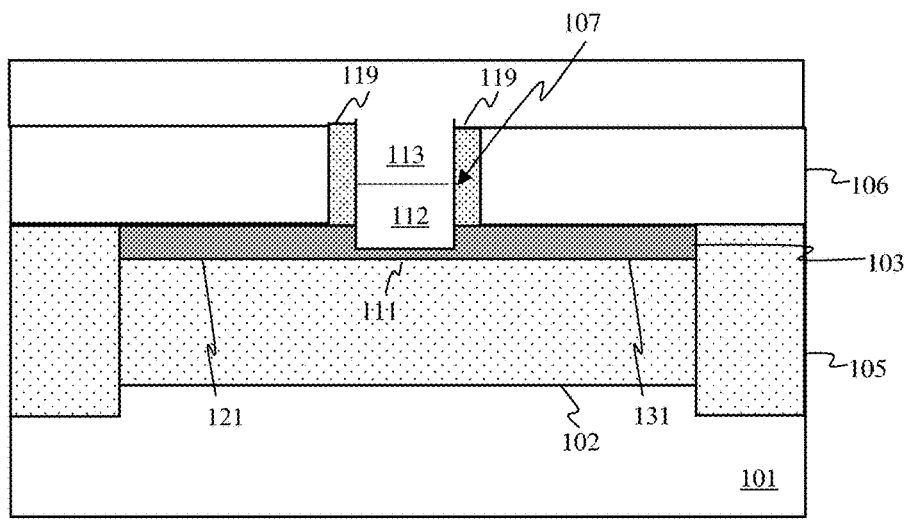

A base region 110 can be formed at least partially within the base opening 107 (see process 210 and FIGS. 6a-6c or, alternatively, FIGS. 7a-7b).

Specifically, in some embodiments, the base region 110 can be formed by, optionally, recessing the exposed base portion 111 at the bottom of the base opening 107 without exposing the insulator layer 102 below (e.g., see FIG. 6a). For example, a selective anisotropic etch process can be performed in order to recess the base portion and further timed so as to stop etching prior to exposure of the insulator layer 102. 111 of the semiconductor layer 103 on the insulator layer 102. As a result of this selective anisotropic etch process, the base portion 111 will be relatively thin as compared to the emitter portion 121 and the collector portion 131 on either side. The thinned base portion 111 can function as a seed layer for epitaxial deposition of base semiconductor layers for a base stack subsequently formed thereon (e.g., see FIG. 6b).

Specifically, a base semiconductor layer 112 can be formed above and immediately adjacent to the base portion 111. The base semiconductor layer 112 can be formed, for example, using a selective epitaxial growth process. Those skilled in the art will recognize that, during a selective epitaxial growth process, semiconductor material is only grown on exposed semiconductor surfaces and not on other material surfaces and further will have essentially the same crystalline structure as the material on which it is grown. Thus, since the base portion 111 is monocrystalline in structure, the base semiconductor layer will also be monocrystalline in structure. This base semiconductor layer 112 can be made of the same semiconductor material as the semiconductor layer 103 (e.g., silicon). Alternatively, when forming an HBT, this base semiconductor layer 112 can be made of a different semiconductor material than the semiconductor layer 103 (e.g., if the semiconductor layer 103 is silicon, the base semiconductor layer 112 could be silicon germanium). In any case, the base semiconductor layer 112 can be either undoped or in situ doped so as to have the first-type conductivity. For example, for an NPN-type BJT, the base semiconductor layer 112 can be undoped (i.e., an intrinsic base layer). Alternatively, for an NPN-type BJT, the base semiconductor layer 112 can be in situ doped so as to have P-type conductivity at a relatively low conductivity level (i.e., a P-base semiconductor layer), so as to have a graded P-type profile (e.g., from undoped or P− at the bottom surface near the base portion 111 of the semiconductor layer 103 to P or P+ at the top surface), or so as to have P-type conductivity at a relatively high conductivity level (i.e., a P+ base layer). Similarly, for a PNP-type BJT, the base semiconductor layer 112 can be undoped (i.e., an intrinsic base layer). Alternatively, for a PNP-type BJT, the base semiconductor layer 112 can be in situ doped so as to have N-type conductivity at a relatively low conductivity level (i.e., an N− base layer), so as to have a graded N-type profile (e.g., from undoped or N− at the bottom surface near the base portion 111 of the semiconductor layer 103 to N or N+ at the top surface), or so as to have N-type conductivity at a relatively high conductivity level (i.e., a N+ base layer).

An additional base semiconductor layer 113 (also referred to herein as an extrinsic base layer) can be formed above and immediately adjacent to the base semiconductor layer 112. This additional base semiconductor layer 113 can be formed, for example, using a non-selective epitaxial growth process. Those skilled in the art will recognize that, during a non-selective epitaxial growth process, semiconductor material is grown on all exposed semiconductor surfaces will generally be polycrystalline or amorphous in structure. Alternatively, the additional base semiconductor layer 113 could formed using a selective epitaxial growth process such that it is monocrystalline in structure. In any case, the additional base semiconductor layer 113 can be made of the same semiconductor material as the base semiconductor layer 112 or, alternatively, a different semiconductor material. For example, the base semiconductor layer 112 can be monocrystalline silicon and the additional base semiconductor layer 113 can be polysilicon. Alternatively, when forming an HBT, the base semiconductor layer 112 can be monocrystalline silicon germanium and the additional base semiconductor layer 113 can be polysilicon. In any case, the additional base semiconductor layer 113 can be in situ doped so as to have the first-type conductivity at a relatively high conductivity level. For example, for an NPN-type BJT, the additional base semiconductor layer 113 can be in situ doped so as to have P+ conductivity; whereas, for a PNP-type HBT, the additional base semiconductor layer 113 can be in situ doped so as to have N+ conductivity.

A CMP process can be performed to remove all base materials from above the level of the top surface of the first mask 106. The additional base semiconductor layer 113 can be recessed. A dielectric cap layer 114 (e.g., a silicon nitride cap layer or a cap layer made of some other suitable dielectric material) can be deposited and another CMP process can be performed to cap the base region 110 (see FIG. 6b). Then, the first mask 106 can be selectively removed and base sidewall spacers 119 can be formed (see FIG. 6c). The base sidewall spacers 119 can be formed using conventional sidewall spacer formation techniques. For example, a sidewall spacer material layer can be conformally over the partially completed structure. Next, a selective anisotropic etch process can be performed so as remove horizontal portions of the sidewall spacer material layer, leaving vertical portions intact as sidewalls spacers 119 on the sidewalls of the base stack. The sidewall spacer material layer can be made, for example, of silicon nitride, silicon carbon nitride, silicon boron carbon nitride or any other suitable sidewall spacer material.

Figure 7C:
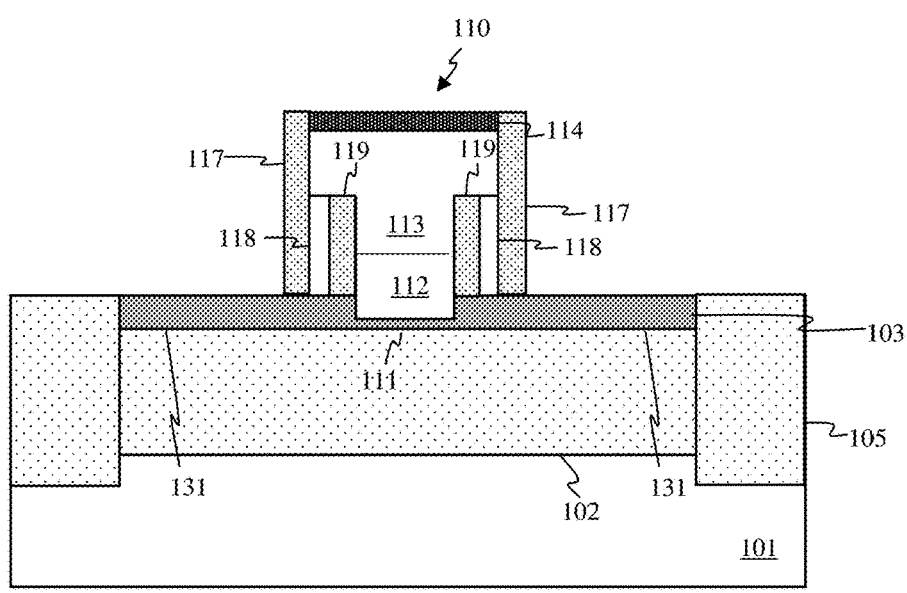

It should be noted that the process flow for base region 110 formation shown in the FIGS. 6a-6c and described above is just one exemplary process flow and not intended to be limiting. Alternatively, any other suitable base formation technique could be employed to form a capped base region. For example, the base region 110 can be formed by, optionally, recessing the exposed base portion 111 at the bottom of the base opening 107 without exposing the insulator layer 102 below in essentially the same manner as described above (e.g., see FIG. 7a). First base sidewall spacers 119 can subsequently be formed within the base opening 107 followed by epitaxial deposition of the base semiconductor layer 112 and the additional base semiconductor layer 113 (see FIG. 7b and discussion of layers 112 and 113 above). However, in this case, instead of performing a CMP process to remove base materials from above the first mask 106, a dielectric cap layer 114 (e.g., a silicon nitride cap layer or a cap layer of some other suitable dielectric material can be formed on the additional base semiconductor layer 113. Then, the dielectric cap layer 114, the additional base semiconductor layer 113, and the first mask 106 below are patterned (e.g., using conventional lithographic patterning and etch processes) such that the resulting base region 110 is capped and essentially T-shaped (see FIG. 7c). That is, as illustrated, the base region 110 can include a lower portion within the base opening 107 and an upper portion, which is aligned above and wider than the lower portion and which further extends laterally over the sidewall spacers 119 and second sidewalls spacers 118 (e.g., remaining portions of the first mask 106). Third sidewall spacers 117 can subsequently be formed so as to cover exposed sidewalls of the upper portion.

Alternatively, any other suitable technique can be performed to form a base region 110 on the base portion 111 of the semiconductor layer 103.

For purposes of illustration, the remaining processes are described below and illustrated with respect to the partially completed semiconductor structure shown in FIG. 6c with an essentially rectangular shaped base region 110.

An emitter region 120 and a collector region 130 can be concurrently formed on opposing sides of the base region 110.

Figure 8:
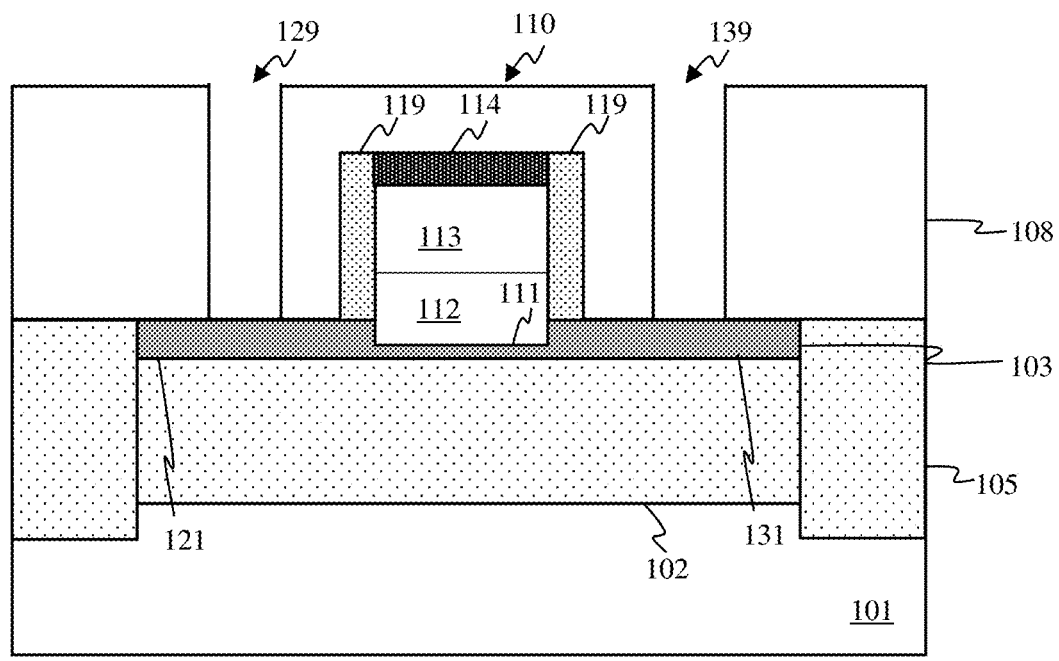
FIGS. 8-9 are cross-section diagrams illustrating partially completed semiconductor structures formed according to the flow diagram of FIG. 2.
Figure 9:
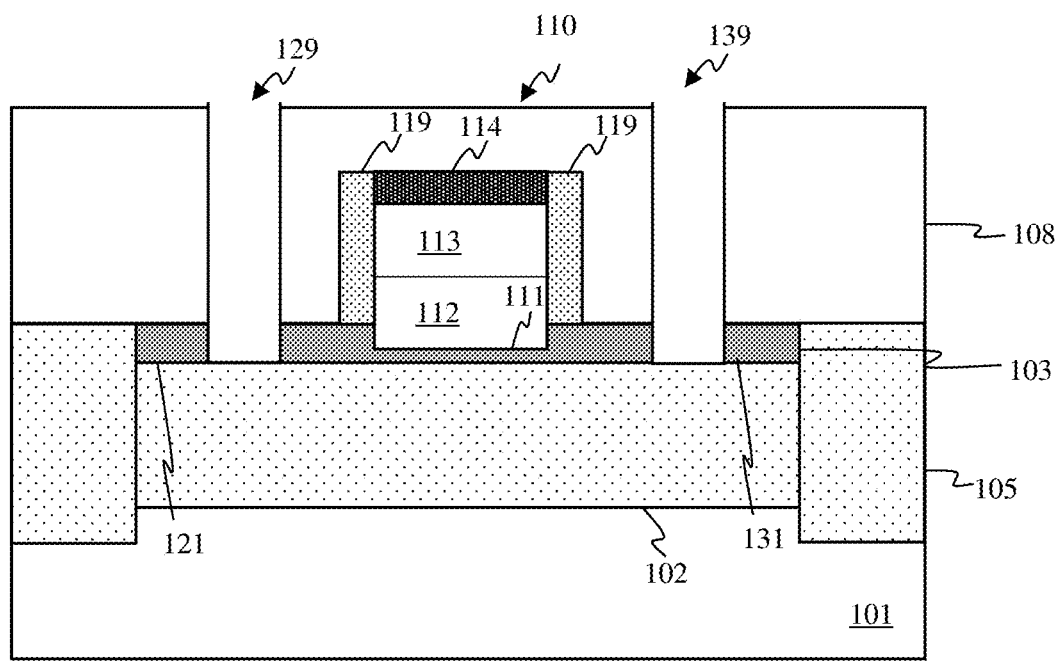

Specifically, a second mask 108 can be formed over the partially completed semiconductor structure (see process 212 and FIG. 8). The second mask 108 can be formed of any suitable mask material that can be selectively removed during subsequent processing. Emitter and collector cavity openings 129 and 139 can be formed (e.g., using conventional lithographic patterning and etch processes) such that they extend essentially vertically through the second mask 108 to the emitter and collector portions 121 and 131, respectively, of the semiconductor layer 103. An anisotropic etch process selective for the material of the semiconductor layer 103 (e.g., selective for silicon) can subsequently be performed so extend the openings 129 and 139 through the emitter and collector portions 121 and 131, respectively, of the semiconductor layer 103 to the insulator layer 102 below (see process 214 and FIG. 9). These emitter and collector cavity openings 129 and 139 can be relatively narrow/small such that the emitter and collector portions 121 and 131 of the semiconductor layer 103 remain essentially intact.

Next, an isotropic etch process selective for the material of the insulator layer 102 (e.g., selective for silicon dioxide) can be performed in order to form emitter and collector cavities 128 and 138, respectively (see process 216 and FIG. 10.1 or 10.2). The resulting emitter cavity 128 can be within the insulator layer 102 aligned below the emitter cavity opening 129 with the bottom surface of the emitter portion 121 of the semiconductor layer 103 as well as surfaces of the insulator layer 102 being exposed within the cavity 128. Similarly, the collector cavity 138 can be within the insulator layer 102 aligned below the collector cavity opening 139 with the bottom surface of the collector portion 131 of the semiconductor layer 103 as well as surfaces of the insulator layer 102 being exposed within the cavity 138. Timing of the isotropic etch process can be performed so that the cavities 128 and 138 are relatively small/shallow (as illustrated in FIG. 10.1, e.g., during formation of the semiconductor structures 100.1 of FIG. 1.1 or 100.3 of FIG. 1.3) or, alternatively, somewhat larger/deeper (as indicated in FIG. 10.2, e.g., during formation of the semiconductor structures 100.2 of FIG. 1.2 or 100.4 of FIG. 1.4). In any case, the isotropic etch process should be stopped so that the cavities remain separated by some predetermined distance so that emitter and collector regions formed therein during subsequent processing remain isolated from each other. Following cavity formation, the insulator layer 102 will have a first thickness (T1) below the base portion 111 of the semiconductor layer 103 (as measured from the top surface of the semiconductor substrate to the top of the insulator layer 102 in that area) and will have a second thickness (T2) that is less than the first thickness below the emitter and collector portions 121 and 131 of the semiconductor layer 103 (as measured from the top surface of the semiconductor substrate to the top of the insulator layer 102 in that area). The second mask 108 can then be selectively removed (e.g., as shown in FIG. 11.1 during formation of the semiconductor structures 100.1 of FIG. 1.1 or 100.3 of FIG. 1.3 or as shown in FIG. 11.2 during formation of the semiconductor structures 100.2 of FIG. 1.2 or 100.4 of FIG. 1.4).

An emitter semiconductor layer 122 and a collector semiconductor layer 132 can be formed on the emitter and collector sides of the base region 110 (see process 218 and FIG. 12.1 or FIG. 12.2). The emitter semiconductor layer 122 and the collector semiconductor layer 132 can be concurrently formed using, for example, a selective epitaxial growth process including in situ doping. As mentioned above, during a selective epitaxial growth process, semiconductor material is only grown on exposed semiconductor surfaces and not on other material surfaces and further will have essentially the same crystalline structure as the material on which it is grown. Thus, emitter semiconductor layer 122 will be grown such that it includes a lower portion within the emitter cavity 128 immediately adjacent to the bottom surface of the emitter portion 121 of the semiconductor layer 103, a middle portion filling the emitter cavity opening 129 from the sides, and an upper portion covering the top surface of the emitter portion 121 of the semiconductor layer 103 and physically separated from the base region 110 by one of the base sidewall spacers 119. Similarly, the collector semiconductor layer 132 will be grown such that it includes a lower portion within the collector cavity 138 immediately adjacent to the bottom surface of the collector portion 131 of the semiconductor layer 103, a middle portion filling the collector cavity opening 139 from the sides, and an upper portion covering the top surface of the collector portion 131 of the semiconductor layer 103 and physically separated from the base region 110 by another one of the base sidewall spacers 119. Additionally, since the emitter and collector semiconductor layers 122 and 132 are selectively grown from exposed surface of the semiconductor layer 103, which is monocrystalline in structure, the emitter and collector semiconductor layers 122 and 132 will also be monocrystalline in structure.

It should be noted that, due to the selective epitaxial grow process and further depending upon the sizes of the emitter cavity opening 129 and the emitter cavity 128, the emitter semiconductor layer 122 either may completely fill the emitter cavity 128 from the bottom surface of the emitter portion 121 downward (e.g., see the partially completed semiconductor structure shown in FIG. 12.1 having a relatively shallow emitter cavity 128 completely filled by the emitter semiconductor layer 122) or may block the emitter cavity opening 129 when the emitter cavity 128 is only partially filled from the bottom surface of the emitter portion 121 downward, thereby leaving a pocket 125 of air, gas or under vacuum at the bottom of the emitter cavity 128 below the emitter semiconductor layer 122 (e.g., see the partially completed semiconductor structure shown in FIG. 12.2 having a relatively deep emitter cavity partially filled by the emitter semiconductor layer 122 and including a pocket 125 of air, of gas or under vacuum). Similarly, due to the selective epitaxial growth process and further depending upon the sizes of the collector cavity opening 139 and the collector cavity 138, the collector semiconductor layer 132 either may completely fill the collector cavity 138 from the bottom surface of the collector portion 131 downward (e.g., see the partially completed semiconductor structure of FIG. 12.1 having a relatively shallow emitter cavity completely filled by the emitter semiconductor layer 122) or may block the collector cavity opening 139 when the collector cavity 138 is only partially filled from the bottom surface of the collector portion 131 downward, thereby leaving a pocket 135 of air, gas or under vacuum at the bottom of the collector cavity 138 below the collector semiconductor layer 132 (e.g., see the partially completed semiconductor structure of FIG. 12.2 having a relatively deep collector cavity partially filled by the collector semiconductor layer 132 and including a pocket 135 of air, of gas or under vacuum). For purposes of this disclosure, a pocket of air, of gas or under vacuum refers to a space encapsulated by solid materials and filled with air, gas or under vacuum such that the air, etc. is trapped within the space. When filled with air, such a pocket is often referred to in the art as an air-gap.

As mentioned above, the emitter semiconductor layer 122 and the collector semiconductor layer 132 can be in situ doped. Specifically, these layers can be doped so as to have the second-type conductivity at a relatively high conductivity level. For example, for an NPN-type BJT, the emitter and collector semiconductor layers 122 and 132 can be doped during deposition so as to be N+ emitter and collector semiconductor layers; whereas, for a PNP-type BJT, the emitter and collector semiconductor layers 122 and 132 can be doped during deposition so as to be P+ emitter and collector semiconductor layers. Furthermore, following formation of the emitter and collector semiconductor layers 122 and 132, an anneal process can be performed in order to cause dopants from the emitter and collector semiconductor layers 122 and 132 to diffuse into the emitter and collector portions 121 and 131, respectively, of the semiconductor layer 103 (e.g., so that these portions also have the second-type conductivity, for example, at a relatively high conductivity level) (see process 220 and the diagonal gray lines in FIGS. 1.1-1.4 representing dopant diffusion throughout the emitter and collector regions 120 and 130, including within the emitter and collector portions 121 and 131, respectively, of the semiconductor layer 103).

It should be noted that the process flow described above is primarily directed to the formation the semiconductor structures 100.1 and 100.2 of FIGS. 1.1 and 1.2, wherein the emitter region 120 and the collector region 130 are formed essentially symmetric relative to the base region 110 and wherein the BJT does not include emitter and collector extension layers.

The process flow can optionally be modified to include the formation of additional symmetric features, such as emitter and collector extension layers (not shown). For example, prior to process 218, relatively thin epitaxial semiconductor layers can be selectively grown on the exposed semiconductor surfaces of the emitter and collector portions 121 and 131 of the semiconductor layer 103. Then, emitter and collector semiconductor layers 122 and 132 (as discussed above) can be selectively epitaxially grown on the emitter and collector extension layers. It should be noted that such emitter and collector extension layers can be made of the same material as the emitter and collector semiconductor layers 122 and 132 (e.g., silicon (Si)) or a different material (e.g., silicon carbide (SiC)). Additionally or alternatively, the emitter and collector extension layers can be in situ doped so as to have different conductivity levels (e.g., lower or higher) than the emitter and collector semiconductor layers 122 and 132. It should be noted that, if such emitter and collector extension layers are formed, the amount of dopant diffusion (as represented by the diagonal gray lines) into the emitter and collector portions 121 and 131 of the semiconductor layer 103 due to the anneal at process 220 and, thereby the conductivity levels of the emitter and collector portions 121 and 131 will vary depending upon the concentration of dopants in the emitter and collector extension layers.

The process flow can also optionally be modified so that the emitter region 120 and the collector region 130 are essentially asymmetric relative to the base region 110 (not shown). For example, the various patterning and etch processes described above could be modified so that the emitter and collector regions have different sizes and/or are separated from the base region by different distances.

This process flow can also optionally be modified to so that the resulting BJT includes additional asymmetric component(s). In some embodiments, the process flow can be modified so that the BJT includes a single extension region on one side of the base region 110 (e.g., a collector extension layer 133 on the collector side of the base region 110 (see the semiconductor structure 100.3 of FIG. 1.3 and the semiconductor structure 100.4 of FIG. 1.4). For example, the emitter side of the partially completed semiconductor structure can be masked (e.g., see the mask 1301 shown in FIG. 13.1 or FIG. 13.2). Then, a relatively thin semiconductor layer (i.e., the collector extension layer 133) can be selectively epitaxially grown on the exposed semiconductor surfaces of the collector portion 131 of the semiconductor layer 103 and the collector semiconductor layer 132 can be selectively epitaxially grown on the collector extension layer 133 (e.g., see FIG. 13.1 or FIG. 13.2). The collector extension layer 133 can be made of the same material as the collector semiconductor layer 132 (e.g., silicon (Si)) or a different material (e.g., silicon carbide (SiC)). Additionally or alternatively, the collector extension layer 133 can be in situ doped so as to have a different conductivity level (e.g., lower or higher) than the collector semiconductor layer 132. The mask 1301 can be selectively removed and the method can further include masking the collector side of the partially completed structure (e.g., see the mask 1401 shown in FIG. 14.1 or FIG. 14.2). Then, the emitter semiconductor layer 122 can be selectively epitaxially grown on exposed surfaces of the emitter portion 121 of the semiconductor layer 103 (e.g., see FIG. 14.1 or FIG. 14.2). The mask 1401 can be selectively removed. Then, the anneal process (process 220) can be performed to facilitate dopant diffusion into the emitter and collector portions 121 and 131 of the semiconductor layer 103 (as represented by the diagonal gray lines within the emitter and collector regions 120 and 130, including within the emitter and collector portions 121 and 131). It should be noted that, if such a collector extension layer 133 is formed, the amount of dopant diffusion into the collector portion 131 of the semiconductor layer 103 due to the anneal at process 220 (and, thereby the conductivity level of the collector portion 131) will vary depending upon the concentration of dopants in the collector extension layer 133 and will be different from the conductivity level of the emitter portion 121.

Optionally, the dielectric cap layer 114 can be removed from the base region 110 and metal silicide layers 189 can be formed on the top surface of the emitter semiconductor layer 122 of the emitter region 120, on the top surface of the collector semiconductor layer 132 of the collector region 130, and on the top surface of the base stack (e.g., on the additional base semiconductor layer 113) of the base region 110 (see process 222 and FIGS. 1.1-1.4). The metal silicide layers 189 can be, for example, layers of cobalt silicide (CoSi), nickel silicide (NiSi), tungsten silicide (WSi), titanium silicide (TiSi), or any other suitable metal silicide material. Techniques for forming metal silicide layers are well known in the art and, thus, have been omitted from the specification to allow the reader to focus on the salient aspects of the disclosed embodiments.

One or one or more layers of middle of the line (MOL) dielectric material 109 can be formed over the partially completed structure (see process 224 and FIGS. 1.1-1.4). For example, a first dielectric layer (also referred to herein as an etch stop layer) can be conformally deposited over emitter region 120, the base region 110 and the collector region 130. This first dielectric layer can be relatively thin and made of silicon nitride or some other suitable etch stop material. A second dielectric layer can be deposited onto the first dielectric layer. The second dielectric layer can be, for example, a blanket layer of ILD material. This ILD material can be, for example, silicon dioxide, doped silicon glass (e.g., phosphosilicate glass (PSG) or borophosphosilicate glass (BPSG)), or any other suitable ILD material. The method can further include forming MOL contacts, which extend essentially vertically through the layer(s) of MOL dielectric material 109 to the BJT terminals (e.g., see the emitter contact 182, the base contact 181, and the collector contact 183) (see process 226 and FIGS. 1.1-1.4). Techniques for MOL dielectric layers and contacts therethrough are well known in the art and, thus, have been omitted from the specification to allow the reader to focus on the salient aspects of the disclosed embodiments.

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an insulator layer,
   a semiconductor layer on the insulator layer;
   an emitter region comprising: an emitter portion of the semiconductor layer; and an emitter semiconductor layer within an emitter cavity in the insulator layer and adjacent to the emitter portion, the emitter semiconductor layer comprising an upper portion over a top surface of the emitter portion of the semiconductor layer;
   a collector region comprising: a collector portion of the semiconductor layer; and a collector semiconductor layer within a collector cavity in the insulator layer and adjacent to the collector portion, the collector semiconductor layer comprising an upper portion over a top surface of the collector portion of the semiconductor layer; and
   a base region positioned laterally between the emitter region and the collector region wherein the emitter cavity and the collector cavity each extend laterally partially below the base region.

2. The structure of claim 1,
   wherein the emitter semiconductor layer fills an emitter opening that extends through the emitter portion to the emitter cavity, and
   wherein the collector semiconductor layer fills a collector opening that extends through the collector portion to the collector cavity.

3. The structure of claim 1,
   wherein the emitter semiconductor layer completely fills the emitter cavity, and
   wherein the collector semiconductor layer completely fills the collector cavity.

4. The structure of claim 1, further comprising a collector extension layer between the collector portion and the collector semiconductor layer.

5. The structure of claim 1, wherein the base region comprises:
   a base portion of the semiconductor layer positioned laterally between the emitter portion and the collector portion; and
   a base stack on the base portion and comprising at least one base semiconductor layer.

6. The structure of claim 5, further comprising dielectric sidewall spacers positioned laterally adjacent to opposing sidewalls of the base stack.

7. The structure of claim 5,
   wherein the base portion is thinner than the emitter portion and the collector portion, and
   wherein the base stack comprises:
      a base semiconductor layer on the base portion; and
      an additional base semiconductor layer on the base semiconductor layer.

8. The structure of claim 7,
   wherein the base semiconductor layer comprises a monocrystalline semiconductor layer, and
   wherein the additional base semiconductor layer comprises a polycrystalline semiconductor layer.

9. The structure of claim 7, wherein base semiconductor layer and the additional base semiconductor layer comprise different semiconductor materials.

10. The structure of claim 7, wherein the base semiconductor layer comprises silicon germanium and wherein the additional base semiconductor layer comprises silicon.

11. The structure of claim 7, wherein the additional base semiconductor layer has a first-type conductivity, wherein the emitter region and the collector region have a second-type conductivity, and wherein base semiconductor layer is any of undoped and doped so as to have the first- type conductivity at a lower conductivity level than the additional base semiconductor layer.

12. A structure comprising:

an insulator layer, a semiconductor layer on the insulator layer;

an emitter region comprising: an emitter portion of the semiconductor layer; and an emitter semiconductor layer partially filling an emitter cavity in the insulator layer and adjacent to the emitter portion, the emitter semiconductor layer comprising an upper portion over a top surface of the emitter portion of the semiconductor layer;

a collector region comprising: a collector portion of the semiconductor layer; and a collector semiconductor layer partially filling a collector cavity in the insulator layer and adjacent to the collector portion, the collector semiconductor layer comprising an upper portion over a top surface of the collector portion of the semiconductor layer; and a base region positioned laterally between the emitter region and the collector region wherein the emitter cavity and the collector cavity each extend laterally partially below the base region.

13. A method comprising:

forming a base region; and forming an emitter region and a collector region, wherein the base region is positioned laterally between the emitter region and the collector region, wherein the emitter region comprises: an emitter portion of a semiconductor layer on an insulator layer; and an emitter semiconductor layer within an emitter cavity in the insulator layer and immediately adjacent to the emitter portion, the emitter semiconductor layer comprising an upper portion over a top surface of the emitter portion of the semiconductor layer, wherein the collector region comprising: a collector portion of the semiconductor layer; and a collector semiconductor layer within a collector cavity in the insulator layer and immediately adjacent to the collector portion, the collector semiconductor layer comprising an upper portion over a top surface of the collector portion of the semiconductor layer, and wherein the emitter cavity and the collector cavity each extend laterally partially below the base region.

14. The method of claim 13, wherein the forming of the emitter region and the collector region comprises:

forming an emitter opening through the emitter portion to the insulator layer and a collector opening through the collector portion to the insulator layer;

forming the emitter cavity and the collector cavity; and performing an epitaxial deposition process so that the emitter semiconductor layer at least partially fills the emitter cavity, fills the emitter opening and further extends onto the top surface of the emitter portion and so that the collector semiconductor layer at least partially fills the collector cavity, fills the collector opening and further extends onto the top surface of the collector portion.

15. The method of claim 14, wherein the emitter semiconductor layer completely fills the emitter cavity, and wherein the collector semiconductor layer completely fills the collector cavity.

16. The method of claim 14, wherein the emitter semiconductor layer only partially fills the emitter cavity, wherein the collector semiconductor layer only partially fills the collector cavity, and wherein the emitter cavity and the collector cavity each further include a pocket of air, of gas, or under vacuum.

17. The method of claim 14, wherein the forming of the base region comprises:

recessing a base portion of the semiconductor layer, wherein the base portion is positioned laterally between the emitter portion and the collector portion; and forming a base stack on the base portion; and forming dielectric sidewall spacers positioned laterally adjacent to opposing sidewalls of the base stack.

18. The method of claim 17, wherein the forming of the base stack comprises:

forming a base semiconductor layer on the base portion, wherein the base semiconductor layer comprises a monocrystalline semiconductor layer; and forming an additional base semiconductor layer on the base semiconductor layer, wherein the additional base semiconductor layer comprises a polycrystalline semiconductor layer.

19. The method of claim 18, wherein base semiconductor layer and the additional base semiconductor layer comprise different semiconductor materials.

20. The method of claim 19, wherein the additional base semiconductor layer has a first-type conductivity, wherein the emitter region and the collector region have a second-type conductivity, and wherein base semiconductor layer is any of undoped and doped so as to have the first-type conductivity at a lower conductivity level than the additional base semiconductor layer.

\* \* \* \* \*